_(12)_ United States Patent
So et al.

(10) Patent No.: US 9,190,458 B2
(45) Date of Patent: Nov. 17, 2015

(54) METHOD AND APPARATUS FOR PROVIDING A WINDOW WITH AN AT LEAST PARTIALLY TRANSPARENT ONE SIDE EMITTING OLED LIGHTING AND AN IR SENSITIVE PHOTOVOLTAIC PANEL

(75) Inventors: Franky So, Gainesville, FL (US); Do Young Kim, Gainesville, FL (US); Bhabendra K. Pradhan, Marietta, GA (US)

(73) Assignees: University of Florida Research Foundation, Inc., Gainesville, FL (US); Nanoholdings, LLC, Rowayton, CT (US)

( * ) Notice: Subject to any disclaimer, the term of this patent is extended or adjusted under 35 U.S.C. 154(b) by 101 days.

(21) Appl. No.: 14/009,994

(22) PCT Filed: Apr. 3, 2012

(86) PCT No.: PCT/US2012/032002
§ 371 (c)(1),
(2), (4) Date: Oct. 4, 2013

(87) PCT Pub. No.: WO2012/138658
PCT Pub. Date: Oct. 11, 2012

(65) Prior Publication Data
US 2014/0070191 A1    Mar. 13, 2014

Related U.S. Application Data

(60) Provisional application No. 61/472,079, filed on Apr. 5, 2011.

(51) Int. Cl.
*H01L 29/08* (2006.01)
*H01L 27/32* (2006.01)
(Continued)

(52) U.S. Cl.
CPC ........ *H01L 27/3227* (2013.01); *H01L 31/0296* (2013.01); *H01L 31/022466* (2013.01);
(Continued)

(58) Field of Classification Search
CPC .. F21V 33/006; F21S 9/037; F21Y 2105/008; H01L 27/3227
USPC .......................................................... 257/40
See application file for complete search history.

(56) References Cited

U.S. PATENT DOCUMENTS

| 7,915,815 B2 | 3/2011 | Birnstock et al. |
| 2004/0004988 A1* | 1/2004 | Cok et al. ........................ 372/70 |

(Continued)

FOREIGN PATENT DOCUMENTS

| EP | 0848433 A2 | 6/1998 |
| EP | 1443806 A1 | 8/2004 |

(Continued)

OTHER PUBLICATIONS

Extended European Search Report dated Sep. 8, 2014 in connection with Application No. 1276466.1.
(Continued)

*Primary Examiner* — Ajay K Arora
(74) *Attorney, Agent, or Firm* — Wolf, Greenfield & Sacks, P.C.

(57) ABSTRACT

Embodiments of the subject invention relate to a method and apparatus for providing a apparatus that can function as a photovoltaic cell, for example during the day, and can provide solid state lighting, for example at night. The apparatus can therefore function as a lighting window. An embodiment can integrate an at least partially transparent one-side emitting OLED and a photovoltaic cell. The photovoltaic cell can be sensitive to infrared light, for example light having a wavelength greater than 1 μm. The apparatus can be arranged such that the one direction in which the OLED emits is toward the inside of a building or other structure and not out into the environment.

103 Claims, 10 Drawing Sheets

(51) Int. Cl.
  *H01L 51/52* (2006.01)
  *H01L 31/0224* (2006.01)
  *H01L 31/0296* (2006.01)
  *H01L 31/0352* (2006.01)
  *F21V 33/00* (2006.01)
  *F21S 9/03* (2006.01)
  *F21Y 105/00* (2006.01)

(52) U.S. Cl.
  CPC .... H01L31/035218 (2013.01); H01L 51/5271 (2013.01); *F21S 9/037* (2013.01); *F21V 33/006* (2013.01); *F21Y 2105/008* (2013.01); *H01L 2251/5323* (2013.01)

(56) References Cited

U.S. PATENT DOCUMENTS

| | | |
|---|---|---|
| 2004/0135222 A1 | 7/2004 | Alfano et al. |
| 2005/0233125 A1 | 10/2005 | Anderson et al. |
| 2005/0233168 A1 | 10/2005 | Magno et al. |
| 2006/0180197 A1 | 8/2006 | Gui et al. |
| 2006/0284170 A1 | 12/2006 | Leo et al. |
| 2008/0238308 A1 | 10/2008 | So |
| 2010/0065834 A1 | 3/2010 | Hammond |
| 2010/0201256 A1 | 8/2010 | Xue et al. |
| 2010/0229921 A1 | 9/2010 | Farris et al. |
| 2010/0282309 A1 | 11/2010 | Pschirer et al. |
| 2010/0326506 A1 | 12/2010 | Lifshitz et al. |
| 2011/0068330 A1 | 3/2011 | Akimoto et al. |
| 2014/0060613 A1 | 3/2014 | So et al. |
| 2014/0061617 A1 | 3/2014 | So et al. |

FOREIGN PATENT DOCUMENTS

| | | |
|---|---|---|
| EP | 1903610 A2 | 3/2008 |
| GB | 2452737 A | 3/2009 |
| JP | 07-122762 A | 5/1995 |
| KR | 10-2011-0032076 A | 3/2011 |
| WO | WO 2007/131126 A2 | 11/2007 |
| WO | WO 2008/140601 A1 | 11/2008 |
| WO | WO 2010/046833 A1 | 4/2010 |
| WO | WO 2011027277 A2 * | 3/2011 |

OTHER PUBLICATIONS

Extended European Search Report dated Aug. 26, 2014 in connection with Application No. 12768560.

Extended European Search Report dated Jul. 30, 2014 in connection with Application No. 12768263.1.

International Search Report and Written Opinion mailed Oct. 31, 2012 in connection with Application No. PCT/US2012/031988.

International Preliminary Report on Patentability mailed Oct. 17, 2013 in connection with Application No. PCT/US2012/031988.

International Search Report and Written Opinion mailed Oct. 31, 2012 in connection with Application No. PCT/US2012/0032008.

International Preliminary Report on Patentability mailed Oct. 17, 2013 in connection with Application No. PCT/US2012/032008.

International Preliminary Report on Patentability mailed Oct. 17, 2013 in connection with Application No. PCT/US2012/032002.

Hass et al., Optical constants and reflectance and transmittance of evaporated aluminum in the visible and ultraviolet. J Opt Soc Am. Jul. 1961;51(7):719-722.

Neyts et al., Semitransparent metal or distributed bragg reflector for wide-viewing-angle organic light-emitting-diode microcavities. J Opt Soc Am. Jan. 2000;17(1):114-119.

Yang et al., Organic light-emitting devices integrated with solar cell: high contrast and energy recycling. Appl Phys Lett. Apr. 2007; 90(17):173507.

International Search Report and Written Opinion mailed Oct. 31, 2012 for PCT/US2012/0032002.

* cited by examiner

METHOD AND APPARATUS FOR PROVIDING A WINDOW WITH AN AT LEAST PARTIALLY TRANSPARENT ONE SIDE EMITTING OLED LIGHTING AND AN IR SENSITIVE PHOTOVOLTAIC PANEL

CROSS-REFERENCE TO RELATED APPLICATION

The present application claims the benefit of U.S. Provisional Application Ser. No. 61/472,079, filed Apr. 5, 2011, the disclosure of which is hereby incorporated by reference herein in its entirety, including any figures, tables, or drawings.

BACKGROUND OF INVENTION

Organic light-emitting devices (OLEDs) incorporate organic materials and emit light. A transparent OLED includes a top electrode and a bottom electrode, both of which are transparent electrodes. A one-sided OLED, which can be either conventional bottom-emitting or top-emitting, generally includes a reflective electrode and a transparent electrode. In both cases, an organic light-emitting layer is included between the electrodes.

BRIEF SUMMARY

Embodiments of the subject invention relate to a method and apparatus for providing a apparatus that can function as a photovoltaic cell, for example during the day, and can provide solid state lighting, for example at night. The apparatus can therefore function as a lighting window. An embodiment can integrate an at least partially transparent one-side emitting OLED and a photovoltaic cell. The photovoltaic cell can be sensitive to infrared light, for example light having a wavelength greater than 1 μm. The apparatus can be arranged such that the one direction in which the OLED emits is toward the inside of a building or other structure and not out into the environment.

In certain embodiments, the photovoltaic cell, for example a photovoltaic cell that can be sensitive to, at least, infrared light (an infrared photovoltaic cell), can incorporate an infrared (IR) sensitizing layer including quantum dots. The quantum dots can be, for example, PbS or PbSe quantum dots, though embodiments are not limited thereto. The photovoltaic cell can be integrated on the at least partially transparent one-side emitting OLED. Referring to FIG. 1, the apparatus can function as a photovoltaic cell, for example during the day, and can provide lighting, for example at night.

In an embodiment, an apparatus can include: an organic light-emitting device (OLED); and a photovoltaic (PV) cell, wherein the PV cell is sensitive to photons having one or more wavelengths, wherein the one or more wavelengths are in a PV cell wavelength range, and wherein at least one of the one or more wavelengths is greater than 0.70 μm. The OLED can include: an organic light emitting layer; a mirror; an OLED anode electrode, wherein the OLED anode electrode is transparent to visible light; and an. OLED cathode electrode, wherein the OLED cathode electrode is transparent to visible light. The organic light emitting layer can be positioned between the OLED anode electrode and the OLED cathode electrode, and the mirror can be positioned such that one of the OLED anode electrode and the OLED cathode electrode is between the mirror and the organic light emitting layer. The mirror can be reflective of a first visible light wavelength range, wherein at least a first portion of visible light emitted by the organic light emitting layer has a wavelength within the first visible light wavelength range, and the mirror can be transmissive to a second visible light wavelength range, wherein the organic light emitting layer does not emit light having wavelengths in at least a portion of the second visible light wavelength range. In a further embodiment, at least one of the one or more wavelengths to which the PV cell is sensitive is greater than 1 μm.

In another embodiment, a method of fabricating an apparatus can include: forming a PV cell, wherein the PV cell is sensitive to photons having one or more wavelengths, wherein the one or more wavelengths are in a PV cell wavelength range, wherein at least one of the one or more wavelengths is greater than 0.70 μm; forming an organic light emitting device (OLED); and coupling the PV cell and the OLED. Forming the OLED can include: forming a mirror; forming an OLED anode electrode on the mirror, wherein the OLED anode electrode is transparent to visible light; forming an organic light-emitting layer on the OLED anode electrode; and forming an OLED cathode electrode on the organic light-emitting layer, wherein the OLED cathode electrode is transparent to visible light. The mirror can be reflective of a first visible light wavelength range, wherein at least a first portion of visible light emitted by the organic light emitting layer has a wavelength within the first visible light wavelength range, and the mirror can be transmissive to a second visible light wavelength range, wherein the organic light emitting layer does not emit light having wavelengths in at least a portion of the second visible light wavelength range. In a further embodiment, at least one of the one or more wavelengths to which the PV cell is sensitive is greater than 1 μm.

In another embodiment, a method of lighting an area can include providing an apparatus, wherein the apparatus includes: an organic light-emitting device (OLED); and a PV cell, wherein the PV cell is sensitive to photons having one or more wavelengths, wherein the one or more wavelengths are in a PV cell wavelength range, and wherein at least one of the one or more wavelengths is greater than 0.70 μm. The OLED can include: an organic light emitting layer; a mirror; an OLED anode electrode, wherein the OLED anode electrode is transparent to visible light; and an OLED cathode electrode, wherein the OLED cathode electrode is transparent to visible light, wherein the organic light emitting layer is positioned between the OLED anode electrode and the OLED cathode electrode, and wherein the mirror is positioned such that one of the OLED anode electrode and the OLED cathode electrode is between the mirror and the organic light emitting layer. The mirror can be reflective of a first visible light wavelength range, wherein at least a first portion of visible light emitted by the organic light emitting layer has a wavelength within the first visible light wavelength range, and the mirror can be transmissive to a second visible light wavelength range, wherein the organic light emitting layer does not emit light having wavelengths in at least a portion of the second visible light wavelength range. In a further embodiment, at least one of the one or more wavelengths to which the PV cell is sensitive is greater than 1 μm.

DETAILED DISCLOSURE

Figure 1A:
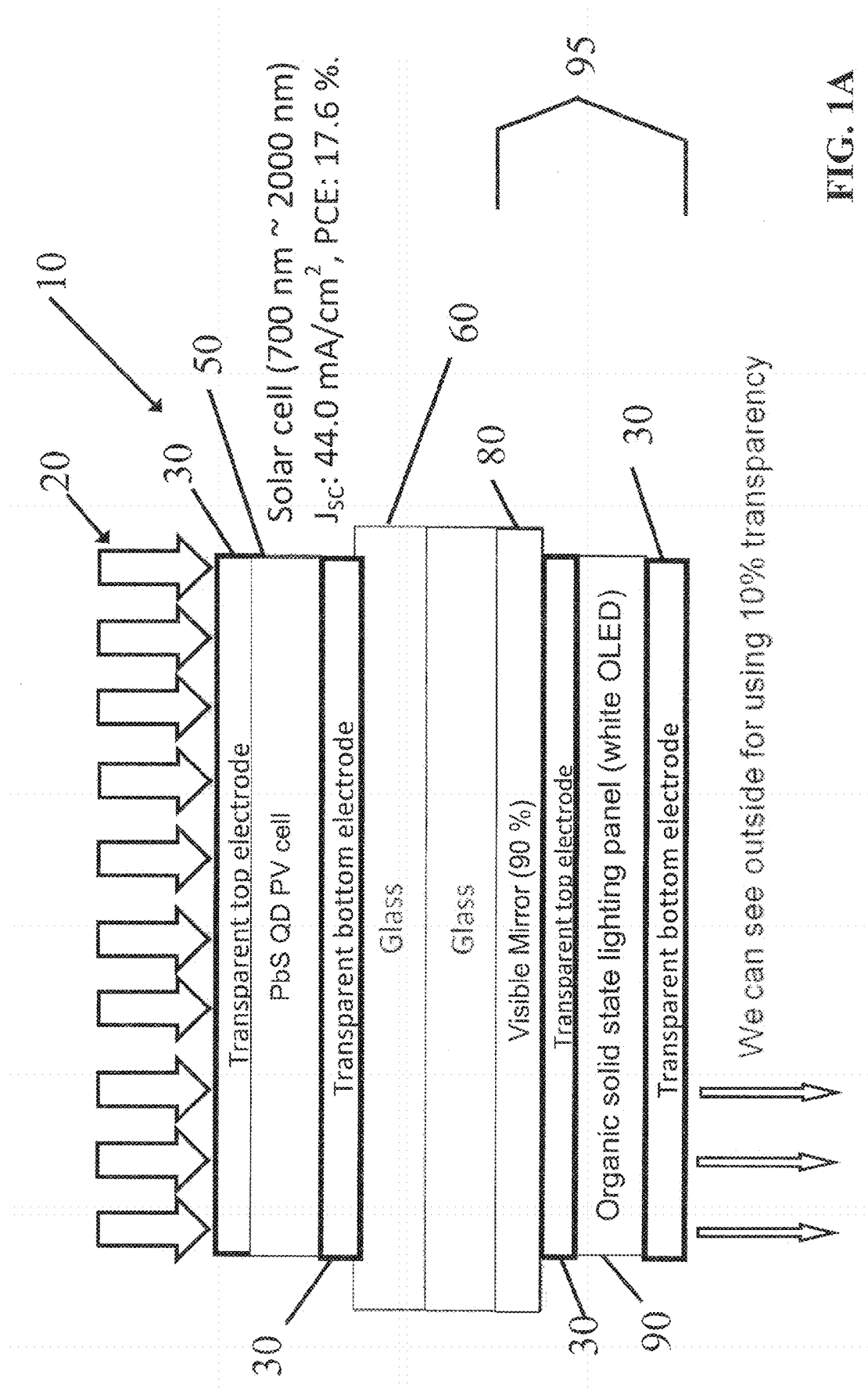
FIGS. 1A and 1B show the operating principle in daytime (FIG. 1A) and nighttime (FIG. 1B) of an apparatus according to an embodiment of the subject invention.

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present. When the term "directly on" is used herein, when referring to layers, regions, patterns, or structures, it is understood that the layer, region, pattern or structure is directly on another layer or structure, such that no intervening layers, regions, patterns, or structures are present.

When the term "about" is used herein, in conjunction with a numerical value, it is understood that the value can be in a range of 95% of the value to 105% of the value, i.e. the value can be +/−5% of the stated value. For example, "about 1 kg" means from 0.95 kg to 1.05 kg.

When the term "at least partially transparent" is used herein, in conjunction with the term "OLED" (e.g., "an at least partially transparent one-side emitting OLED", "an at least partially transparent OLED"), it is understood that the OLED, which may include a mirror and/or a mirror substrate, allows at least a portion of the visible spectrum of light to pass through the OLED. When the term "transparent" is used herein, in conjunction with the term "anode", "cathode", or "electrode", it is understood that the anode, cathode, or electrode allows the light produced by the light emitting layer to pass through the anode, cathode, or electrode without significant reflection.

When the term "sensitive" is used herein, in conjunction with describing a photovoltaic cell being sensitive to a certain type of light or to photons having a wavelength of a given value or within a given range, it is understood that the photovoltaic cell is capable of absorbing the light to which it is sensitive and generating a carrier. When the term "not sensitive" or "insensitive" is used herein, in conjunction with describing a photovoltaic cell not being sensitive or being insensitive to a certain type of light or to photons having a wavelength of a given value or within a given range, it is understood that the photovoltaic cell is not able to absorb the light to which it is not sensitive and generate a carrier from the absorption of the light.

Embodiments of the subject invention relate to a method and apparatus for providing an apparatus that can function as a photovoltaic (PV) cell, for example during the day, and can provide solid state lighting, for example at night. The apparatus can therefore function as a lighting window. An embodiment can integrate an at least partially transparent one-side emitting OLED and a PV cell. The PV cell can be sensitive to infrared light, for example light having a wavelength greater than 1 μm. In a further embodiment, the PV cell can be sensitive to light having a wavelength greater than 0.85 μm. In yet a further embodiment, the PV cell can be sensitive to light having a wavelength greater than 0.70 μm. The apparatus can be arranged such that the one direction in which the OLED emits is toward the inside of a building or other structure and not out into the environment.

In certain embodiments, the PV cell, for example a PV cell that can be sensitive to, at least, infrared light (an infrared PV cell), can incorporate an infrared (IR) sensitizing layer including quantum dots. The quantum dots can be, for example, PbS or PbSe quantum dots, though embodiments are not limited thereto. The PV cell can be integrated on the at least partially transparent one-side emitting OLED. Referring to FIG. 1, the apparatus can function as a PV cell, for example during the day, and can provide lighting, for example at night. The apparatus can also be at least partially transparent to at least a portion of visible light, thereby functioning as a lighting window.

Embodiments of the subject invention relate to a method and apparatus for providing an apparatus including an at least partially transparent one-side emitting OLED. The at least partially transparent one-side emitting OLED can include a mirror substrate with a transparent anode electrode and a transparent cathode electrode. The mirror can allow at least a portion of the visible spectrum of light to pass through while also reflecting at least another portion of the visible spectrum of light. For example, the mirror can reflect at least a portion of the visible light emitted by a light emitting layer (e.g., an organic light emitting layer) of the OLED. In an embodiment, the OLED can include a dielectric stack mirror, an indium tin oxide (ITO) bottom anode, electrode and a Mg:Ag top cathode electrode.

When making a window using an at least partially transparent one-side emitting OLED and a PV cell, it is advantageously possible to see outside while harnessing solar energy via the PV cell, such as during the day, and have the one-side emitting OLED act as a lighting source, such as at night, because the OLED light is primarily emitted in one direction. The window can be arranged such that the one direction in which the OLED emits is into a building or other structure and not out into the environment. The window can also be arranged such that the PV cell can absorb solar energy, such as during the day.

In an embodiment of the subject invention, the at least partially transparent and one-side emitting OLED of an apparatus can incorporate a mirror substrate, such as a dielectric mirror substrate. The OLED can further include a transparent anode electrode, an organic light-emitting layer, and a transparent cathode electrode. In a specific embodiment, the mirror can be a dielectric stack mirror and can include alternating layers of $Ta_2O_5$ and $SiO_2$. In a particular embodiment, the OLED can include: a glass substrate; a dielectric stack mirror on the glass substrate, wherein the dielectric stack mirror incorporates alternating layers of $Ta_2O_5$ and $SiO_2$; a transparent anode electrode on the dielectric stack mirror, wherein the transparent anode electrode includes ITO; a hole transporting layer on the transparent anode; an organic light-emitting layer on the hole transporting layer; and a transparent cathode electrode on the organic light-emitting layer, wherein the transparent cathode electrode includes a Mg:Ag/Alq3 stack layer, wherein the Mg:Ag layer has a thickness of less than 30 nm, and wherein Mg and Ag are present in a ratio of 10:1 (Mg:Ag), and wherein the Alq3 layer has a thickness of from 0 nm to 200 nm.

In yet a further embodiment of the subject invention, a method of fabricating an at least partially transparent and one-side emitting OLED can include: forming a PV cell, forming an OLED, and coupling the PV cell and the OLED. The step of forming the OLED can include: forming a mirror; forming a transparent anode on the mirror; forming an organic light-emitting layer on the transparent anode; and forming a transparent cathode on the organic light-emitting layer. The mirror can be, for example, a dielectric stack mirror, wherein the dielectric stack mirror includes alternating layers of two dielectric materials having different refractive indexes.

An apparatus incorporating a PV cell and an at least partially transparent one-side emitting OLED, as described herein, can be transparent to light having a certain wavelength or wavelengths, such that it is possible to see outside in daytime as the PV cell absorbs solar energy, while also being a source of lighting when it is dark outside. The OLED light is emitted primarily in one direction, and the apparatus can be arranged such that the light is emitted into a building or other structure and not into the environment. In embodiments, the at least partially OLED may be transparent to a portion of the visible spectrum of light, while reflecting another portion of the visible spectrum of light. The OLED of the apparatus can include: a light emitting layer (e.g., an organic light emitting layer) which emits light having a wavelength in a given range of the visible spectrum; and a mirror that is reflective of at least a portion of the light emitted by the light emitting layer of the OLED. The mirror can also be transparent to at least a portion of the visible spectrum of light not emitted by the OLED.

Figure 1B:
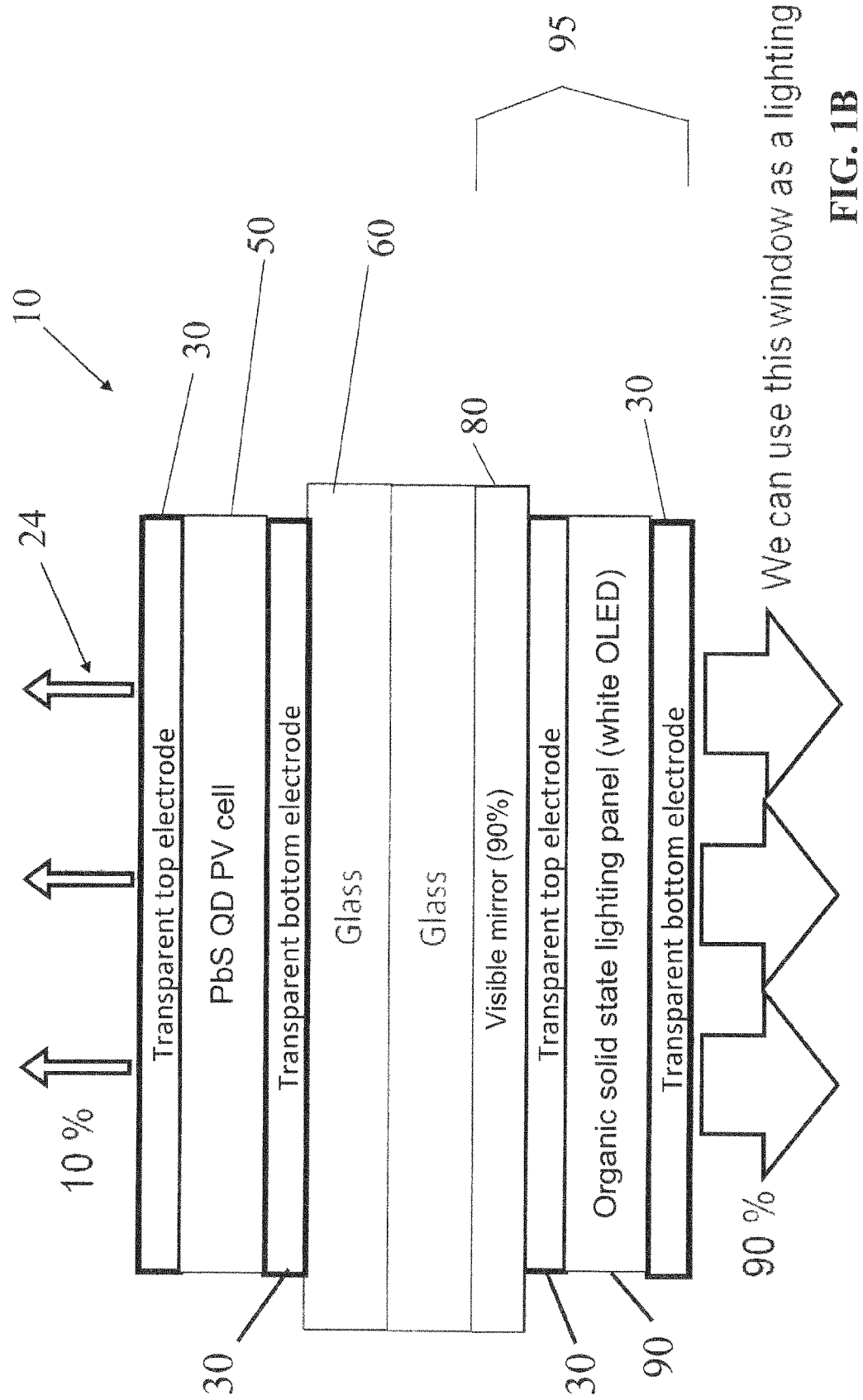

Referring to FIG. 1A, incident light 20, for example from the outside environment, can be incident on the PV cell 50, and a portion of the incident light can travel through the apparatus 10 such that the apparatus is at least partially transparent to visible light 20 and the apparatus can be used for viewing the outside environment from inside, e.g., during the day. Referring to FIG. 1B, the apparatus can 10 be used to generate light (24, 26), e.g., at night when it is dark outside, a large percentage of which (e.g., about 90% or >90%) is transmitted in one direction 26, while only a small fraction (e.g., about 10% or <10%) is lost in the opposite direction 24. In this way, as a large portion of the light from the OLED 95 is transmitted in one direction, we refer to the OLED 95 as a one-sided OLED. The apparatus can be positioned such that a vast majority of the light produced 26 is provided in a desirable location (e.g., inside a building or structure or towards an area needing light outside) while only a small portion is lost in the opposite direction 24. The apparatus 10 can optionally include a glass substrate 60 and/or one or more electrode layers 30. In many embodiments, each electrode layer 30 can be any transparent electrode known in the art, for example, a layer including indium tin oxide (ITO), carbon nanotubes (CNTs), indium zinc oxide (IZO), a silver nanowire, and/or a magnesium:silver/Alq3 (Mg:Ag/Alq3) stack layer. Each electrode layer 30 can include a transparent conductive oxide (TCO), including a TCO other than those explicitly listed herein. The apparatus 10 can also include a visible mirror 80. In a specific embodiment, the visible mirror can allow infrared (IR) radiation to pass through the mirror.

Figure 2A:
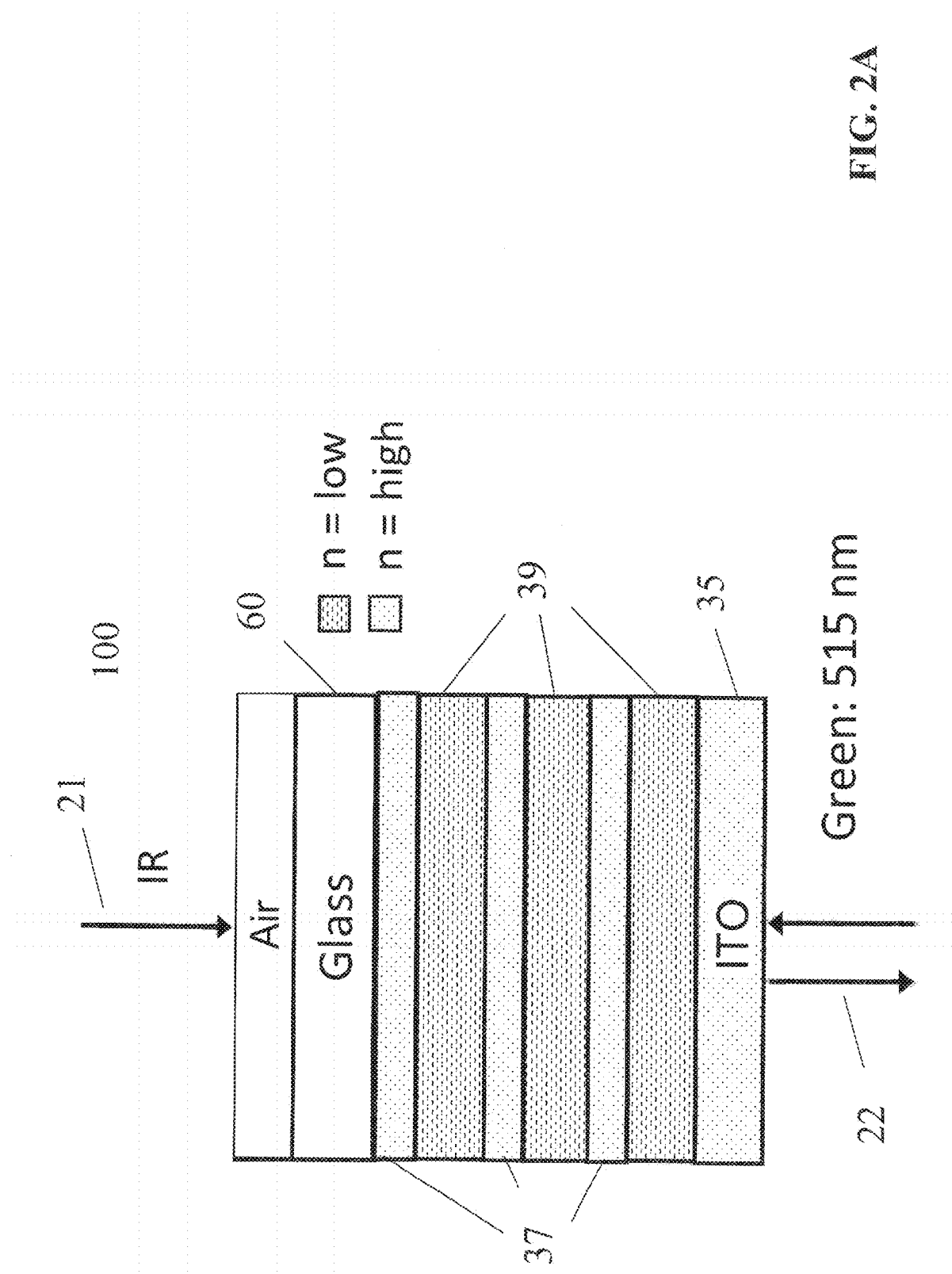
FIG. 2A shows a cross-sectional view of a dielectric stack mirror that can be incorporated into an OLED according to an embodiment of the subject invention.

Referring to FIG. 2A, a dielectric stack mirror 100, which can be incorporated into an OLED of a apparatus according to embodiments of the subject invention, can include alternating layers of dielectric material (37, 39) having different indexes of refraction (n). For example, the higher n material 37 can be $Ta_2O_5$, and the lower n material 39 can be $SiO_2$, though embodiments are not limited thereto. Each layer (37, 39) can have a thickness of from about 10 nm to about 100 nm, and there can be from 1 to 40 (in quantity) of each type of layer.

The dielectric stack mirror 100 can optionally be positioned adjacent to a glass substrate 60 and/or positioned adjacent to an electrode of the OLED, such as an ITO layer 35. In an embodiment, the dielectric stack mirror 100 can be transparent to light 21 in a certain wavelength range (or ranges), such as infrared (IR) light and/or a portion of the visible light spectrum, while reflecting light 22 of a certain wavelength range (or ranges), such as another portion of the visible light spectrum. That is, the dielectric stack mirror 100 can have a reflectivity of about 10% or <10% for light 21 in a certain wavelength range (or ranges) while having a reflectivity of about 90% or >90% for light 22 of a certain wavelength range (or ranges). For example, the dielectric stack mirror 100 can be transparent to (at least) infrared (IR) light and/or red light while reflecting (at least) green light. In a specific embodiment, the dielectric stack mirror reflects the light produced by the light emitting layer 90.

In certain embodiments, the dielectric stack mirror can incorporate alternating layers of $Ta_2O_5$ and $SiO_2$. Each $Ta_2O_5$ layer can have a thickness of, for example, from about 10 nm to about 100 nm, and each $SiO_2$ layer can have a thickness of for example, from about 10 nm to about 100 nm. The dielectric stack mirror can include, for example, N layers of $Ta_2O_5$, wherein the number of layers of $SiO_2$, is in a range of from N−1 to N+1, and wherein N is in a range of from 1 to 40.

Figure 2B:
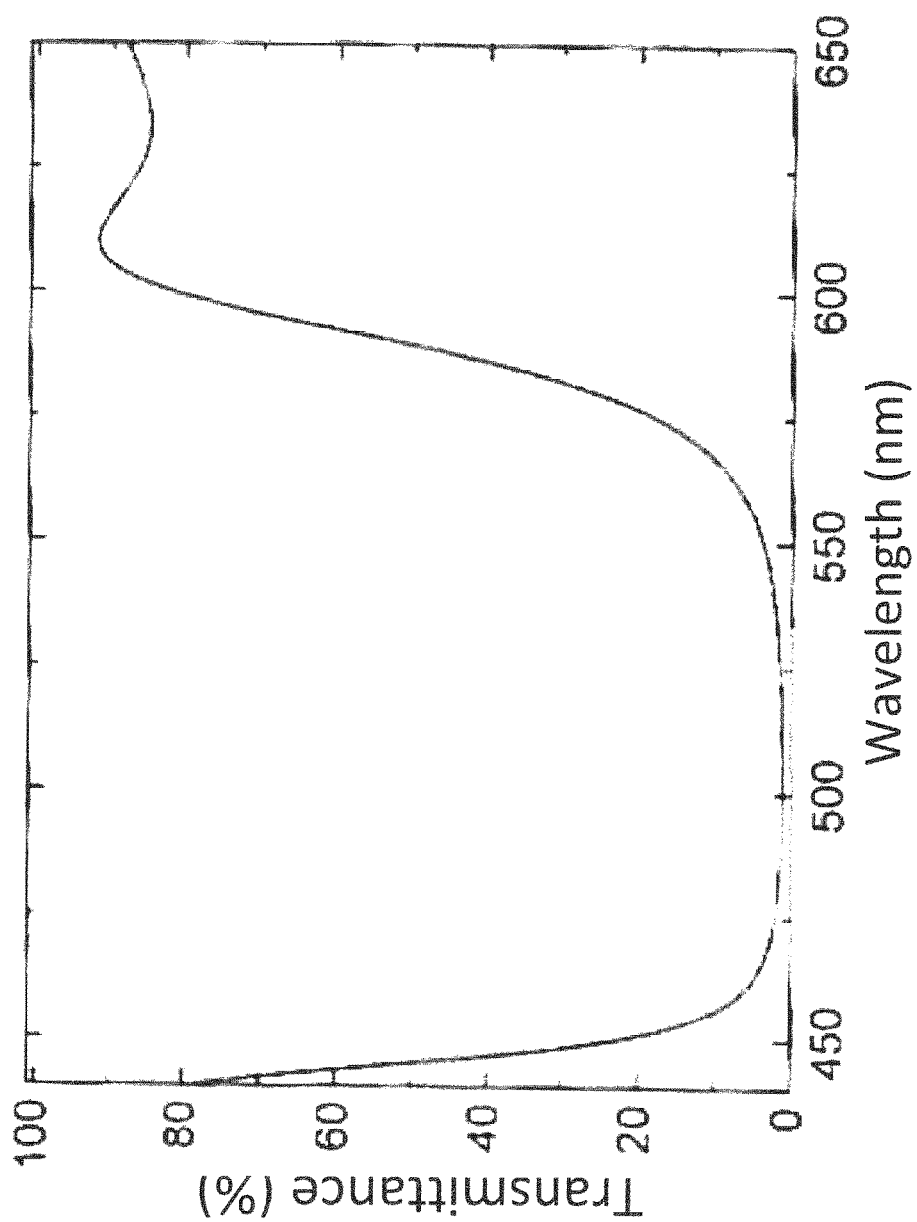
FIG. 2B shows a transmittance spectrum for the dielectric stack mirror of FIG. 2A.

Referring to FIG. 2B, in an embodiment, the dielectric stack mirror 100 can have a reflectivity of over 98% for light having a wavelength in a range of from 475 nm to 550 nm and a transmittance of at least 80% (i.e. a reflectivity of 20% or less) for light having a wavelength of 440 nm or 600 nm. Looking through the dielectric stack mirror 100 can appear like the image in FIG. 3A, such that light passing through the dielectric stack mirror can have a light-reddish appearance, as the dielectric stack mirror is transparent for red light.

Figure 3A:
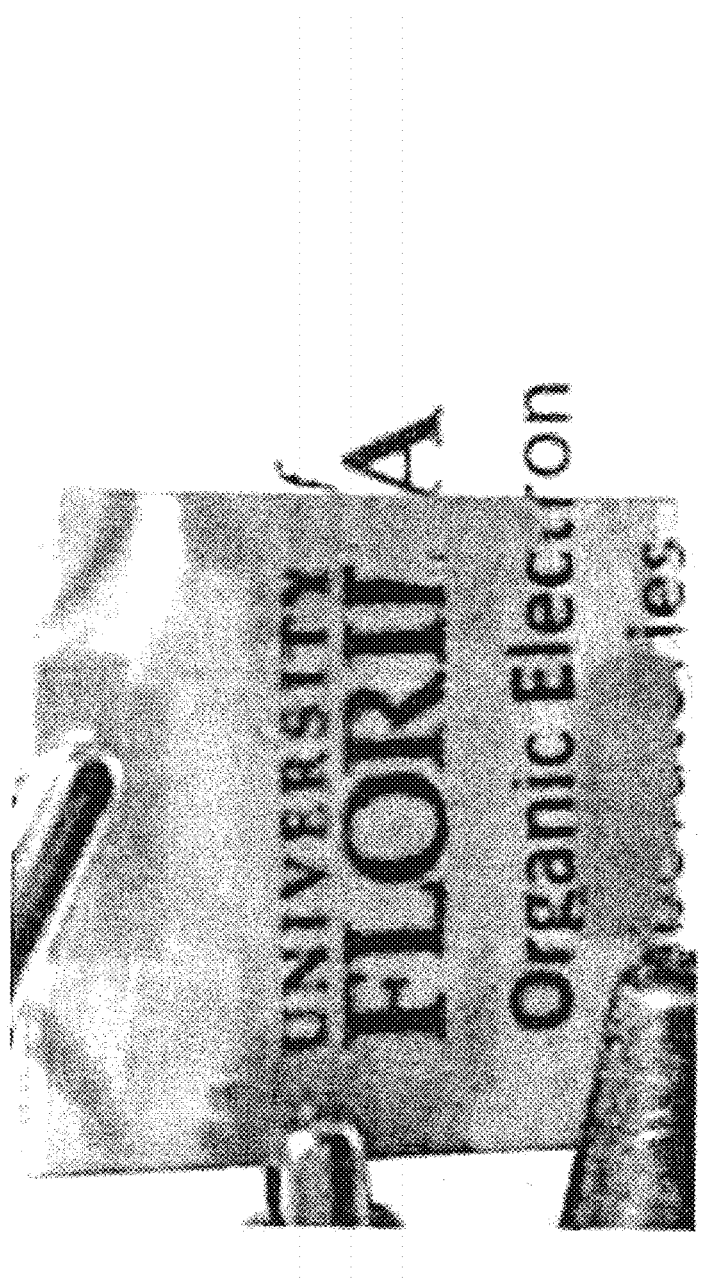
FIG. 3A shows a transparent image as seen through a transparent one-side emitting OLED according to an embodiment of the subject invention.
Figure 3B:
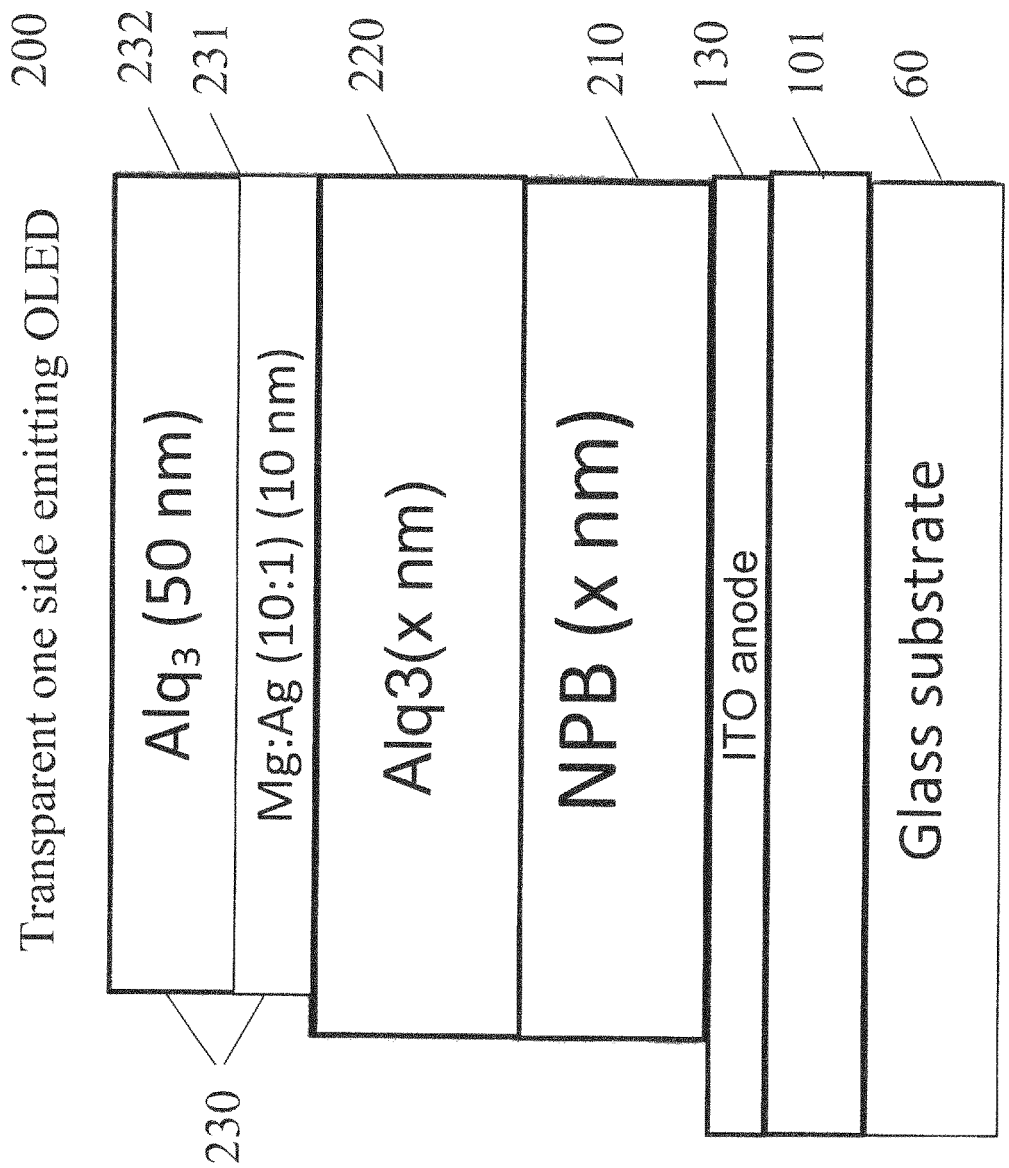
FIG. 3B shows a cross-sectional view of an OLED according to an embodiment of the subject invention.

Referring to FIG. 3B, in an embodiment, an at least partially transparent and one-side emitting OLED 200 of an apparatus can include a mirror 101 (such as a dielectric stack mirror), a transparent anode electrode 130 on the mirror 101, an organic light-emitting layer 220 on the transparent anode electrode 130, and a transparent cathode electrode 230 on the organic light-emitting layer 220. The OLED 200 can optionally include a glass substrate 60 under the mirror 101. The OLED 200 can also optionally include a hole transporting layer 210 on the transparent anode electrode 130 and under the organic light-emitting layer 220. The OLED 200 can also optionally include an electron transporting layer (not shown).

In an embodiment, the dielectric stack mirror 101 can include alternating layers of $Ta_2O_5$ and $SiO_2$. Each $Ta_2O_5$ layer can have a thickness of from about 10 nm to about 100 nm, and each $SiO_2$ layer can have a thickness of from about 10 nm to about 100 nm. The dielectric stack mirror 101 can include N layers of $Ta_2O_5$, wherein the number of layers of $SiO_2$, is a range of from N−1 to N+1, and wherein N is in a range of from 1 to 40.

The organic light-emitting layer 220 can include, for example, Iridium tris(2-phenylpyidine) (Ir(ppy)$_3$), [2-methoxy-5-(2-ethylhexyloxy)-p-phenylenevinylene] (MEH-PPV), Tris-(8-quinolinolato) aluminum) (Alq3), and/or bis

[(4,6-di-fluorophenyl)-pyridinate]picolinate (FIrpic), though embodiments are not limited thereto. The hole transporting layer 210 can include (N,N'-di-[(1-naphthalenyl)-N,N'-diphenyl]-(1,1'-biphenyl)-4,4'-diamine) (NPB), 1,1-bis((di-4-tolylamino)phenyl)cyclohexane (TAPC), (poly(9,9-dioctylfluorene-co-N-(4-butylphenyl)diphenylamine)) (TFB), and/or diamine derivative (TPD), though embodiments are not limited thereto. The electron transporting layer (not shown) can include BCP, Bphen, 3TPYMB, and/or Alq3, though embodiments are not limited thereto. The transparent anode electrode 37 can include indium tin oxide (ITO), carbon nanotubes (CNTs), indium zinc oxide (IZO), a silver nanowire, or a magnesium:silver/Alq3 (Mg:Ag/Alq3) stack layer, though embodiments are not limited thereto. The transparent cathode electrode 230 can include ITO, CNTs, IZO, a silver nanowire, or a Mg:Ag/Alq3 stack layer, though embodiments are not limited thereto.

In an embodiment, the transparent cathode electrode 230 can include a Mg:Ag/Alq3 stack layer. The Mg:Ag layer 231 can have a thickness of less than 30 nm. In a particular embodiment, the Mg:Ag layer 231 can have a thickness of about 10 nm. In a further embodiment, the Mg:Ag layer 231 can have a thickness of 11 nm. Mg and Ag can be present in a ratio of 10:1 (Mg:Ag) or about 10:1 (Mg:Ag). The Alq3 232 layer can have a thickness of from 0 nm to 200 nm. In a particular embodiment, the Alq3 232 layer can have a thickness of about 50 nm. In a further embodiment, the Alq3 layer 232 can have a thickness of 50 nm.

The transparent anode electrode 130, the organic light-emitting layer 220, the hole transporting layer 210 (if present), and the electron transporting layer (if present) can each have a thickness of from about 10 nm to about 500 nm. More specifically, each of these layers can have a thickness of from about 40 nm to about 200 nm. In a particular embodiment, the transparent anode electrode 130 can have thickness of about 110 nm, the organic light-emitting layer 220 can have a thickness of about 70 nm, and the hole transporting layer 210 can have a thickness of about 70 nm.

In an embodiment of the subject invention, a method of fabricating an at least partially transparent and one-side emitting OLED can include: forming a PV cell, forming an OLED, and coupling the PV cell and the OLED. The step of forming the OLED can include: forming a mirror; forming a transparent anode on the mirror; forming an organic light-emitting layer on the transparent anode; and forming a transparent cathode on the organic light-emitting layer. The mirror can be, for example, a dielectric stack mirror, wherein the dielectric stack mirror includes alternating layers of two dielectric materials having different refractive indexes.

In certain embodiments, a dielectric stack mirror can include alternating layers of $Ta_2O_5$ and $SiO_2$, wherein each $Ta_2O_5$ layer has a thickness of from about 10 nm to about 100 nm, wherein each $SiO_2$ layer has a thickness of from about 10 nm to about 100 nm, wherein the dielectric stack mirror includes N layers of $Ta_2O_5$, wherein the number of layers of $SiO_2$, is a range of from N−1 to N+1, and wherein N is in a range of from 1 to 40. The dielectric stack mirror can have a reflectivity of greater than 98% for light having a wavelength in a range of from 475 nm to 550 nm, and wherein the dielectric stack mirror has a reflectivity of less than 20% for light having a wavelength of 440 nm, and wherein the dielectric stack mirror has a reflectivity of less than 20% for light having a wavelength of 600 nm.

In many embodiments, the transparent cathode electrode includes a Mg:Ag/Alq3 stack layer, and forming the transparent cathode electrode includes: forming a Mg:Ag layer at a thickness of less than 30 nm, wherein Mg and Ag are present in a ratio of 10:1 (Mg:Ag); and forming an Alq3 layer on the Mg:Ag layer at a thickness of from 0 nm to 200 nm.

According to embodiments of the subject invention, an advantageous apparatus can include an at least partially transparent, one-side emitting OLED that utilizes a mirror with a transparent anode electrode (e.g. an ITO bottom anode electrode) and a transparent cathode electrode (e.g. a thin Mg:Ag/Alq3 top cathode electrode). The mirror can have a very high (e.g., about 90% or >90%) reflectivity for light having a wavelength in a certain range (or ranges) while having a low (e.g., 20% or less) reflectivity for light having a wavelength in a different range or ranges. For example, the mirror can have a reflectivity of over 98% for light having a wavelength in the range of from about 475 nm to about 550 nm and a transmittance of >80% (reflectivity of 20% or less) for light having a wavelength of about 440 nm or about 600, as shown in FIG. 2A. The mirror can be transparent to at least a portion of the visible spectrum of light, and light passing through it can have, for example, a light-reddish appearance as seen in FIG. 3A. In many embodiments, more than 90% of the light emitted from the OLED will transmit through the transparent anode electrode, and only a very small fraction (<10%) of light in certain wavelength ranges can transmit through the mirror.

In many embodiments of the subject invention, the OLED of the apparatus can incorporate a mirror. The OLED can include a light emitting layer (e.g., an organic light emitting layer) which emits light having a given wavelength in the visible spectrum or having a wavelength within a range, at least a portion of which is in the visible spectrum. The mirror can reflect at least a portion of the visible light emitted by the light emitting layer of the OLED. For example, the mirror can reflect greater than 90% of the visible light emitted by the light emitting layer of the OLED. In various embodiments, the mirror can reflect any one of the following percentages or ranges of visible light emitted by the light emitting layer of the OLED: 90%, about 90%, >91%, 91%, about 91%, >92%, 92%, about 92%, >93%, 93%, about 93%, >94%, 94%, about 94%, >95%, 95%, about 95%, >96%, 96%, about 96%, >97%, 97%, about 97%, >98%, 98%, about 98%, >99%, 99%, about 99%, about 100%, 100%, >89%, 89%, about 89%, >88%, 88%, about 88%, >87%, 87%, about 87%, >86%, 86%, about 86%, >85%, 85%, about 85%, >84%, 84%, about 84%, >83%, 83%, about 83%, >82%, 82%, about 82%, >81%, 81%, about 81%, >80%, 80%, about 80%, >79%, 79%, about 79%, >78%, 78%, about 78%, >77%, 77%, about 77%, >76%, 76%, about 76%, >75%, 75%, about 75%, >74%, 74%, about 74%, >73%, 73%, about 73%, >72%, 72%, about 72%, >71%, 71%, about 71%, >70%, 70%, about 70%, at least 90%, at least 91%, at least 92%, at least 93%, at least 94%, at least 95%, at least 96%, at least 97%, at least 98%, at least 99%, at least 89%, at least 88%, at least 87%, at least 86%, at least 85%, at least 84%, at least 83%, at least 82%, at least 81%, at least 80%, at least 79%, at least 78%, at least 77%, at least 76%, at least 75%, at least 74%, at least 73%, at least 72%, at least 71%, or at least 70%.

The mirror can also be transparent or transmissive to at least a portion of light in the visible spectrum. For example, the mirror can be reflective of <20% (i.e., transmissive to >80%) of a portion of the visible light that does not include the portion of the visible spectrum emitted by the light emitting layer of the OLED (that is, <20% of the visible light having a wavelength in a range that does not overlap with the wavelength or wavelength range of the light emitted by the light emitting layer of the OLED). In various embodiments, the mirror can be reflective of any one of the following percentages or ranges of visible light having a wavelength or wavelength range that does not overlap with the light emitted by the light emitting layer of the OLED: 20%, about 20%, <21%, 21%, about 21%, <22%, 22%, about 22%, <23%, 23%, about 23%, <24%, 24%, about 24%, <25%, 25%, about 25%, <26%, 26%, about 26%, <27%, 27%, about 27%, <28%, 28%, about 28%, <29%, 29%, about 29%, about 0%, 0%, <19%, 19%, about 19%, <18%, 18%, about 18%, <17%, 17%, about 17%, <16%, 16%, about 16%, <15%, 15%, about 15%, <14%, 14%, about 14%, <13%, 13%, about 13%, <12%, 12%, about 12%, <11%, 11%, about 11%, <10%, 10%, about 10%, <9%, 9%, about 9%, <8%, 8%, about 8%, <7%, 7%, about 7%, <6%, 6%, about 6%, <5%, 5%, about 5%, <4%, 4%, about 4%, <3%, 3%, about 3%, <2%, 2%, about 2%, <1%, 1%, about 1%, <30%, 30%, about 30, no more than 20%, no more than 21%, no more than 22%, no more than 23%, no more than 24%, no more than 25%, no more than 26%, no more than 27%, no more than 28%, no more than 29%, no more than 19%, no more than 18%, no more than 17%, no more than 16%, no more than 15%, no more than 14%, no more than 13%, no more than 12%, no more than 11%, no more than 10%, no more than 9%, no more than 8%, no more than 7%, no more than 6%, no more than 5%, no more than 4%, no more than 3%, no more than 2%, no more than 1%, or no more than 30%.

The mirror can be transparent or transmissive to at least a portion of light in the visible spectrum. For example, the mirror can be reflective of >80% of the entire spectrum of visible light. In various embodiments, the mirror can be reflective of any one of the following percentages or ranges of the entire spectrum of visible light: 20%, about 20%, <21%, 21%, about 21%, <22%, 22%, about 22%, <23%, 23%, about 23%, <24%, 24%, about 24%, <25%, 25%, about 25%, <26%, 26%, about 26%, <27%, 27%, about 27%, <28%, 28%, about 28%, <29%, 29%, about 29%, <30%, 30%, or about 30%, <31%, 31%, about 31%, <32%, 32%, about 32%, <33%, 33%, about 33%, <34%, 34%, about 34%, <35%, 35%, about 35%, <36%, 36%, about 36%, <37%, 37%, about 37%, <38%, 38%, about 38%, <39%, 39%, about 39%, 40%, 40%, or about 40%, <41%, 41%, about 41%, <42%, 42%, about 42%, <43%, 43%, about 43%, <44%, 44%, about 44%, <45%, 45%, about 45%, <46%, 46%, about 46%, <47%, 47%, about 47%, <48%, 48%, about 48%, <49%, 49%, about 49%, 50%, 50%, or about 50%, <51%, 51%, about 51%, <52%, 52%, about 52%, <53%, 53%, about 53%, <54%, 54%, about 54%, <55%, 55%, about 55%, <56%, 56%, about 56%, <57%, 57%, about 57%, <58%, 58%, about 58%, <59%, 59%, about 59%, 60%, 60%, or about 60%, <61%, 61%, about 61%, <62%, 62%, about 62%, <63%, 63%, about 63%, <64%, 64%, about 64%, <65%, 65%, about 65%, <66%, 66%, about 66%, <67%, 67%, about 67%, <68%, 68%, about 68%, <69%, 69%, about 69%, 70%, 70%, or about 70%, <71%, 71%, about 71%, <72%, 72%, about 72%, <73%, 73%, about 73%, <74%, 74%, about 74%, <75%, 75%, about 75%, <76%, 76%, about 76%, <77%, 77%, about 77%, <78%, 78%, about 78%, <79%, 79%, about 79%, 80%, 80%, or about 80%, <81%, 81%, about 81%, <82%, 82%, about 82%, <83%, 83%, about 83%, <84%, 84%, about 84%, <85%, 85%, about 85%, <86%, 86%, about 86%, <87%, 87%, about 87%, <88%, 88%, about 88%, <89%, 89%, about 89%, 90%, about 90%, >90%, >89%, >88%, >87%, >86%, >85%, >84%, >83%, >82%, >81%, >80%, >79%, >78%, >77%, >76%, >75%, >74%, >73%, >72%, >71%, >70%, >20%, >21%, >22%, >23%, >24%, >25%, >26%, >27%, >28%, >29%, >30%, >31%, >32%, >33%, >34%, >35, >36%, >37%, >38%, >39%, >40%, >41%, >42%, >43%, >44%, >45%, >46%, >47%, >48, >49%, >50%, >51%, >52%, >53%, >54%, >55%, >56%, >57%, >58%, >59%, >60%, >61%, >62%, >63%, >64%, >65%, >66%, >67%, >68%, >69%, at least 90%, at least 89%, at least 88%, at least 87%, at least 86%, at least 85%, at least 84%, at least 83%, at least 82%, at least 81%, at least 80%, at least 79%, at least 78%, at least 77%, at least 76%, at least 75%, at least 74%, at least 73%, at least 72%, at least 71%, at least 70%, at least 20%, at least 21%, at least 22%, at least 23%, at least 24%, at least 25%, at least 26%, at least 27%, at least 28%, at least 29%, at least 19%, at least 18%, at least 17%, at least 16%, at least 15%, at least 14%, at least 13%, at least 12%, at least 11%, at least 10%, at least 9%, at least 8%, at least 7%, at least 6%, at least 5%, at least 4%, at least 3%, at least 2%, at least 1%, at least 30%, at least 31%, at least 32%, at least 33%, at least 34%, at least 35, at least 36%, at least 37%, at least 38%, at least 39%, at least 40%, at least 41%, at least 42%, at least 43%, at least 44%, at least 45%, at least 46%, at least 47%, at least 48, at least 49%, at least 50%, at least 51%, at least 52%, at least 53%, at least 54%, at least 55%, at least 56%, at least 57%, at least 58%, at least 59%, at least 60%, at least 61%, at least 62%, at least 63%, at least 64%, at least 65%, at least 66%, at least 67%, at least 68%, at least 69%, no more than 90%, no more than 89%, no more than 88%, no more than 87%, no more than 86%, no more than 85%, no more than 84%, no more than 83%, no more than 82%, no more than 81%, no more than 80%, no more than 79%, no more than 78%, no more than 77%, no more than 76%, no more than 75%, no more than 74%, no more than 73%, no more than 72%, no more than 71%, no more than 70%, no more than 20%, no more than 21%, no more than 22%, no more than 23%, no more than 24%, no more than 25%, no more than 26%, no more than 27%, no more than 28%, no more than 29%, no more than 30%, no more than 31%, no more than 32%, no more than 33%, no more than 34%, no more than 35, no more than 36%, no more than 37%, no more than 38%, no more than 39%, no more than 40%, no more than 41%, no more than 42%, no more than 43%, no more than 44%, no more than 45%, no more than 46%, no more than 47%, no more than 48, no more than 49%, no more than 50%, no more than 51%, no more than 52%, no more than 53%, no more than 54%, no more than 55%, no more than 56%, no more than 57%, no more than 58%, no more than 59%, no more than 60%, no more than 61%, no more than 62%, no more than 63%, no more than 64%, no more than 65%, no more than 66%, no more than 67%, no more than 68%, or no more than 69%.

In an embodiment, the OLED of the apparatus can incorporate a mirror and can include a light emitting layer (e.g., an organic light emitting layer) that emits light, at least a portion of which is in the visible spectrum. In various embodiments, the mirror can reflect at least 80%, or at least 90%, of the visible light emitted by the light emitting layer of the OLED and can also be reflective of no more than 90% of visible light other than the light emitted by the light emitting layer of the OLED. In various embodiments, the mirror can reflect any of the values of ranges listed above of the visible light emitted by the light emitting layer of the OLED and can also be reflective of any of the values of ranges listed above for wavelength ranges of visible light that do not overlap with the wavelength range including the light emitted by the light emitting layer of the OLED.

According to an embodiment of the subject invention, an advantageous apparatus can include an at least partially transparent one-side emitting OLED that can include a mirror, a transparent anode electrode (e.g., an ITO bottom anode electrode), a transparent cathode electrode (e.g. a thin Mg:Ag/Alq3 top cathode electrode), and an organic light emitting layer. In various embodiments, the mirror can reflect at least 80%, or at least 90%, of the visible light emitted by the organic light emitting layer and can reflect no more than 90% of the visible light other than the light emitted by the organic light emitting layer of the OLED. The mirror can be a dielectric stack mirror and can include alternating layers of two dielectric materials having different refractive indexes. The dielectric materials can be, for example, $Ta_2O_5$ and $SiO_2$.

In a further embodiment, the mirror can reflect at least 80% of the visible light emitted by the organic light emitting layer and can reflect no more than 80% of the visible light other than the light emitted by the organic light emitting layer of the OLED.

In yet a further embodiment, the mirror can reflect at least 80% of the visible light emitted by the organic light emitting layer and can reflect no more than 50% of the visible light other than the light emitted by the organic light emitting layer of the OLED.

In yet a further embodiment, the mirror can reflect at least 80% of the visible light emitted by the organic light emitting layer and can reflect no more than 20% of the visible light other than the light emitted by the organic light emitting layer of the OLED.

In yet a further embodiment, the mirror can reflect at least 90% of the visible light emitted by the organic light emitting layer and can reflect no more than 50% of the visible light other than the light emitted by the organic light emitting layer of the OLED.

In yet a further embodiment, the mirror can reflect at least 90% of the visible light emitted by the organic light emitting layer and can reflect no more than 20% of the visible light other than the light emitted by the organic light emitting layer of the OLED.

In yet a further embodiment, the mirror can reflect at least 90% of the visible light emitted by the organic light emitting layer and can reflect no more than 10% of the visible light other than the light emitted by the organic light emitting layer of the OLED.

In yet a further embodiment, the mirror can reflect at least 80% of the visible light emitted by the organic light emitting layer and can reflect no more than 10% of the visible light other than the light emitted by the organic light emitting layer of the OLED.

In many embodiments, the subject invention can include a PV cell, wherein the PV cell is sensitive to photons having one or more wavelengths, wherein the one or more wavelengths are in a wavelength range (which can be referred to as, e.g. a "PV cell wavelength range"), such that at least one of the one or more wavelengths is not in the PV cell wavelength range. At least one of the one or more wavelengths to which the PV cell can be sensitive can be greater than 1 µm. In a further embodiment, at least one of the one or more wavelengths to which the PV cell can be sensitive can be greater than 0.85 µm. In yet a further embodiment, at least one of the one or more wavelengths to which the PV cell can be sensitive can be greater than 0.75 µm. In yet a further embodiment, at least one of the one or more wavelengths to which the PV cell can be sensitive can be greater than 0.70 µm.

As is known in the art, the visible range of the spectrum is from 380 nm to 750 nm, inclusive.

Figure 4A:
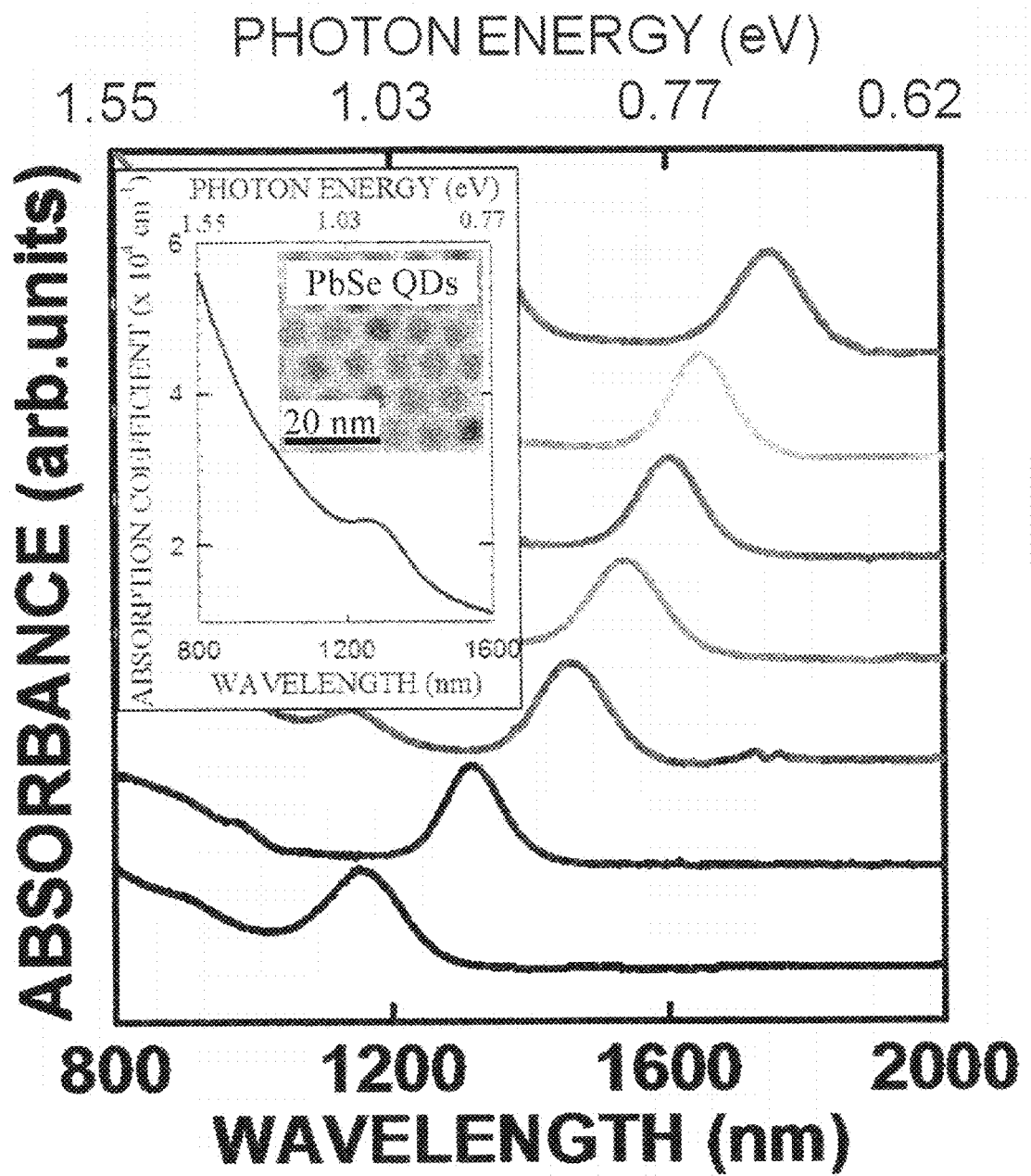
FIG. 4A shows the absorbance spectra of PbS nanocrystals with various sizes, and the inset shows the absorption coefficient spectrum and TEM image of 50 nm thick PbSe quantum dot film with 1.3 μm peak wavelength.
Figure 4B:
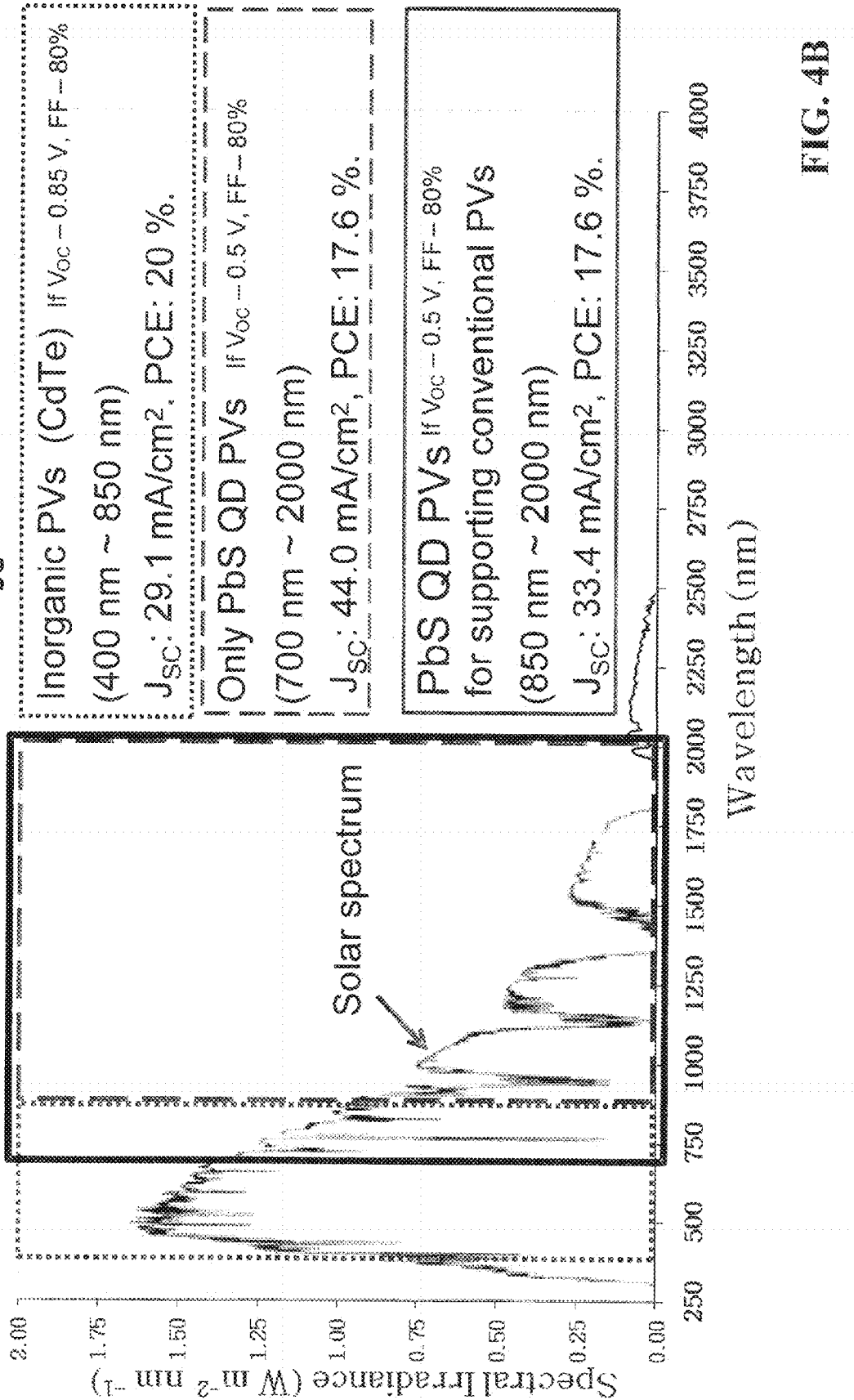
FIG. 4B shows the theoretical maximum of the short circuit current density ($J_{SC}$) and the power conversion efficiency (PCE) of an embodiment of the subject invention.

Referring to FIG. 4B, a PV cell of an apparatus according to an embodiment of the subject invention can result in an increased power conversion efficiency (PCE). FIG. 4B shows spectral irradiance ($W/m^2$ nm) vs. wavelength (nm) of the incident light. For an inorganic photovoltaic cell (for example, including CdTe), which is sensitive to light having a wavelength in the range of from about 400 nm to about 850 nm, if all the photons in the range of from about 400 nm to about 850 nm are converted to the carriers, $J_{SC}$ is 29.1 mA/cm² and if $V_{OC}$ is 0.85 V and the fill factor (FF) is 80%, PCE is 20%. For an IR PV cell including PbS quantum dots and sensitive to light having a wavelength in the range of from about 700 nm to about 2000 nm, if all the photons in the range of from about 700 nm to about 2000 nm are converted to the carriers, $J_{SC}$ is 44.0 mA/cm² and if $V_{OC}$ is 0.5 V and FF is 80%, PCE is 17.6%. For an IR PV cell including PbS quantum dots and sensitive to light having a wavelength in the range of from about 850 nm to about 2000 nm, if all the photons in the range of from about 850 nm to about 2000 nm are converted to the carriers, $J_{SC}$ is 33.4 mA/cm² and if $V_{OC}$ is 0.5 V and FF is 80%, PCE is 13.4%.

Infrared photodetectors using solution-processable nanocrystals PbS or PbSe nanocrystals) have been described in U.S. patent application Ser. No. 13/272,995 (filed Oct. 13, 2011), which claims priority to U.S. Provisional Patent Application Ser. No. 61/416,630 (filed Nov. 23, 2010), the disclosures of both of which are hereby incorporated by reference in their entirety. Such IR photodetectors have been shown to be compatible with large area manufacturing. In embodiments of the subject invention, a photovoltaic cell can have a structure similar to that of the infrared photodetector described in U.S. patent application Ser. No. 13/272,995, which claims priority to U.S. Provisional Patent Application Ser. No. 61/416,630, and/or similar to that of the infrared photodetector described in U.S. Provisional Patent Application Ser. No. 61/416,630. Also, referring to FIG. 4A, which shows the absorbance of PbSe quantum dots, PbSe quantum dots have infrared sensitivity.

Referring again to FIGS. 1A and 1B, according to many embodiments, the PV cell 50 (e.g., an IR PV cell) of the apparatus 10 can be sensitive to photons having a wavelength greater than 1 µm. In an embodiment, the PV cell 50 is sensitive to photons having a wavelength up to 2500 nm. In another embodiment, the PV cell 50 is sensitive to photons having a wavelength up to about 2000 nm. In a further embodiment, the PV cell 50 is sensitive to photons having a wavelength up to 2000 nm. In yet a further embodiment, the PV cell 50 is sensitive to photons having a wavelength in a range of from about 850 nm to about 2000 nm.

It is to be understood that, in this description and in the appended claims, when a PV cell 50 is described as sensitive to photons having a wavelength of a given value, in a given range, or of at least a certain value, this does not preclude the PV cell 50 from being sensitive to photons having a wavelength different from the given value, outside the given range, or of less than the certain value, unless explicitly stated. That is, in this description and in the appended claims, when a PV cell 50 is described as sensitive to photons having a wavelength of a given value, in a given range, or of at least a certain value, the PV cell 50 is sensitive to at least those photons and may or may not also be sensitive to photons having a wavelength different from the given value, outside the given range, or of less than the certain value, unless it is explicitly stated that the PV cell 50 is only sensitive to photons having the stated value or in the stated range or that the PV cell 50 is not sensitive to photons having a given value, within a given range, or greater than a certain value.

In various embodiments, the PV cell 50 can be sensitive to photons having a wavelength of at least any of the following values (all values are in µm): 0.40, 0.41, 0.42, 0.43, 0.44, 0.45, 0.46, 0.47, 0.48, 0.49, 0.50, 0.51, 0.52, 0.53, 0.54, 0.55, 0.56, 0.57, 0.58, 0.59, 0.60, 0.61, 0.62, 0.63, 0.64, 0.65, 0.66, 0.67, 0.68, 0.69, 0.70, 0.71, 0.72, 0.73, 0.74, 0.75, 0.76, 0.77, 0.78, 0.79, 0.80, 0.81, 0.82, 0.83, 0.84, 0.85, 0.86, 0.87, 0.88, 0.89, 0.90, 0.91, 0.92, 0.93, 0.94, 0.95, 0.96, 0.97, 098, 0.99, 1.00, 1.01, 1.02, 1.03, 1.04, 1.05, 1.06, 1.07, 1.08, 1.09, 1.10, 1.11, 1.12, 1.13, 1.14, 1.15, 1.16, 1.17, 1.18, 1.19, 1.20, 1.21, 1.22, 1.23, 1.24, 1.25, 1.26, 1.27, 1.28, 1.29, 1.30, 1.31, 1.32, 1.33, 1.34, 1.35, 1.36, 1.37, 1.38, 1.39, 1.40, 1.41, 1.42, 1.43, 1.44, 1.45, 1.46, 1.47, 1.48, 1.49, 1.50, 1.51, 1.52, 1.53, 1.54, 1.55, 1.56, 1.57, 1.58, 1.59, 1.60, 1.61, 1.62, 1.63, 1.64, 1.65, 1.66, 1.67, 1.68, 1.69, 1.70, 1.71, 1.72, 1.73, 1.74, 1.75, 1.76, 1.77, 1.78, 1.79, 1.80, 1.81, 1.82, 1.83, 1.84, 1.85, 1.86, 1.87, 1.88, 1.89, 1.90, 1.91, 1.92, 1.93, 1.94, 1.95, 1.96, 1.97, 1.98, or 1.99 (i.e., the PV cell 50 can be sensitive to photons having a wavelength of: at least 0.40 µm, at least 0.41 µm, . . . , at least 1.99 µm). In further embodiments, the PV cell 50 can be sensitive to only those photons having a wavelength of at least any of the following values (all values are in µm), while not being sensitive to any photons having a wavelength of less than the value: 0.40, 0.41, 0.42, 0.43, 0.44, 0.45, 0.46, 0.47, 0.48, 0.49, 0.50, 0.51, 0.52, 0.53, 0.54, 0.55, 0.56, 0.57, 0.58, 0.59, 0.60, 0.61, 0.62, 0.63, 0.64, 0.65, 0.66, 0.67, 0.68, 0.69, 0.70, 0.71, 0.72, 0.73, 0.74, 0.75, 0.76, 0.77, 0.78, 0.79, 0.80, 0.81, 0.82, 0.83, 0.84, 0.85, 0.86, 0.87, 0.88, 0.89, 0.90, 0.91, 0.92, 0.93, 0.94, 0.95, 0.96, 0.97, 098, 0.99, 1.00, 1.01, 1.02, 1.03, 1.04, 1.05, 1.06, 1.07, 1.08, 1.09, 1.10, 1.11, 1.12, 1.13, 1.14, 1.15, 1.16, 1.17, 1.18, 1.19, 1.20, 1.21, 1.22, 1.23, 1.24, 1.25, 1.26, 1.27, 1.28, 1.29, 1.30, 1.31, 1.32, 1.33, 1.34, 1.35, 1.36, 1.37, 1.38, 1.39, 1.40, 1.41, 1.42, 1.43, 1.44, 1.45, 1.46, 1.47, 1.48, 1.49, 1.50, 1.51, 1.52, 1.53, 1.54, 1.55, 1.56, 1.57, 1.58, 1.59, 1.60, 1.61, 1.62, 1.63, 1.64, 1.65, 1.66, 1.67, 1.68, 1.69, 1.70, 1.71, 1.72, 1.73, 1.74, 1.75, 1.76, 1.77, 1.78, 1.79, 1.80, 1.81, 1.82, 1.83, 1.84, 1.85, 1.86, 1.87, 1.88, 1.89, 1.90, 1.91, 1.92, 1.93, 1.94, 1.95, 1.96, 1.97, 1.98, or 1.99 (i.e. the PV cell 50 can be sensitive to only those photons having a wavelength of: at least 0.40 µm, at least 0.41 µm, . . . , at least 1.99 µm; while not being sensitive to any photons having a wavelength of less than 0.40 µm, 0.41 µm, . . . , 1.99 µm, respectively).

In certain embodiments, the PV cell 50 can include an IR sensitizing layer including quantum dots. The quantum dots can be, for example, PbS or PbSe quantum dots, though embodiments are not limited thereto.

In many embodiments, the apparatus 10 can include an electrode 30 on one or both sides of the PV cell 50. In one embodiment, PV cell 50 includes a transparent anode and a transparent cathode. Each electrode layer 30 can be any transparent electrode known in the art, for example, a layer including indium tin oxide (ITO), carbon nanotubes (CNTs), indium zinc oxide (IZO), a silver nanowire, and/or a magnesium:silver/Alq3 (Mg:Ag/Alq3) stack layer. In a specific embodiment, one or more of the transparent electrode layers can be a Mg:Ag/Alq3 stack layer such that the Mg:Ag layer has a ratio of 10:1 (Mg:Ag). The Mg:Ag layer can have a thickness of less than 30 nm, and the Alq3 layer can have a thickness of from 0 nm to 200 nm. Each electrode layer 30 can be transparent to at least a portion of the light in the visible region of the spectrum. Each electrode layer 30 can be transparent to at least a portion, and preferably all, of the light in the infrared region of the spectrum. In certain embodiments, each electrode layer 30 can be transparent to at least a portion, and preferably all, of the light in the visible region of the spectrum and at least a portion, and preferably all, of the light in the infrared region of the spectrum. In an embodiment, the apparatus 10 can include a glass substrate 60 between the OLED 90 and the PV cell 50. For example, the PV cell 50 can be fabricated on the glass substrate 60, and then the glass substrate 60 can be coupled onto the OLED 90 which may also include a glass substrate 60.

In many embodiments, the apparatus 10 can be configured such that light incident on an input surface of the PV 50, which passes through the PV cell 50 and exits an output surface of the PV cell 50, is incident on an input surface of the OLED 95 and enters and passes through the OLED 95.

In one embodiment of the subject invention, a method of lighting an area can include providing an apparatus, wherein the apparatus comprises an OLED and a PV cell. The OLED and the PV cell can be as those described herein. For example, the PV cell can be sensitive to photons having a first one or more wavelengths, wherein the first one or more wavelengths are in a PV cell wavelength range, and wherein at least one of the first one or more wavelengths is greater than 1 µm. In a further embodiment, at least one of the first one or more wavelengths is be greater than 0.85 µm. In yet a further embodiment, at least one of the first one or more wavelengths is be greater than 0.75 µm. In yet a further embodiment, at least one of the first one or more wavelengths is be greater than 0.70 µm. The OLED can include an organic light emitting layer, a mirror, a first anode electrode, wherein the first anode electrode is transparent to visible light; and a first cathode electrode, wherein the first cathode electrode is transparent to visible light. The organic light emitting layer can be positioned between the first anode electrode and the first cathode electrode, and the mirror can be positioned such that one of the first anode electrode and the first cathode electrode is between the mirror and the organic light emitting layer. The mirror can be reflective of a first visible light wavelength range, wherein at least a first portion of visible light emitted by the organic light emitting layer has a wavelength within the first visible light wavelength range, and wherein the mirror is transmissive to a second visible light wavelength range. The organic light emitting layer can be configured such that it does not emit light having wavelengths in at least a portion of the second visible light wavelength range.

The PV cell of the apparatus can be sensitive to at least photons having a wavelength greater than, for example, 1 µm. In an embodiment, the PV cell of the apparatus can be sensitive to at least photons having a wavelength greater than, for example, 0.85 µm. In yet a further embodiment, the PV cell of the apparatus can be sensitive to at least photons having a wavelength greater than, for example, 0.75 µm. In yet a further embodiment, the PV cell of the apparatus can be sensitive to at least photons having a wavelength greater than, for example, 0.70 µm. In an embodiment, the PV cell is sensitive to photons having a wavelength up to 2500 nm. In another embodiment, the PV cell is sensitive to photons having a wavelength up to about 2000 nm. In a further embodiment, the PV cell is sensitive to photons having a wavelength up to 2000 nm. In yet a further embodiment, the PV cell is sensitive to photons having a wavelength in a range of from about 850 nm to about 2000 nm. In yet a further embodiment, the PV cell is sensitive to photons having a wavelength in a range of from about 750 nm to about 2000 nm. In yet a further embodiment, the PV cell is sensitive to photons having a wavelength in a range of from about 700 nm to about 2000 nm. In yet a further embodiment, the PV cell is sensitive to photons having a wavelength in a range of from about 1000 nm to about 2000 nm. In yet a further embodiment, the PV cell is sensitive to photons having a wavelength in a range of from about 850 nm to about 2500 nm. In yet a further embodiment, the PV cell is sensitive to photons having a wavelength in a range of from about 750 nm to about 2500 nm. In yet a further embodiment, the PV cell is sensitive to photons having a wavelength in a range of from about 700 nm to about 2500 nm. In yet a further embodiment, the PV cell is sensitive to photons having a wavelength in a range of from about 1000 nm to about 2500 nm.

In certain embodiments, the PV cell can include an IR sensitizing layer including quantum dots. The quantum dots can be, for example, PbS or PbSe quantum dots, though embodiments are not limited thereto.

In embodiments of the subject invention, the apparatus can be configured such that incident light is incident upon the PV cell and at least a portion of the light is absorbed by the PV cell and at least a portion of the light passes through the PV cell and the OLED.

In an embodiment, a method of forming an apparatus can include fabricating the PV cell on a glass substrate and then coupling the glass substrate to OLED. The method can also include forming the OLED on a glass substrate such that the glass substrate of the PV cell is coupled to the glass substrate of the OLED.

In a further embodiment, the PV cell can be coated on an optically clear plastic film, and then the optically clear plastic film can be coupled to the OLED. In yet a further embodiment, the OLED can be coated on an optically clear plastic film, and then the optically clear plastic film can be coupled to the PV cell. In yet a further embodiment, both the OLED and the PV cell can be coated on an optically clear plastic film, and the optically clear plastic film of the PV cell can be coupled to the optically clear plastic film of the OLED. The optically clear plastic film can be transparent to at least a portion, and preferably all, visible light.

In certain embodiments, one or more additional PV cells can be incorporated into an apparatus of the subject invention. Each of the one or more additional PV cells can be sensitive to light in the visible spectrum and/or in the infrared spectrum. For example, a conventional PV cell can be included that is sensitive to, e.g., visible light. In a particular embodiment, any additional PV cell that is included is not sensitive to at least a portion of the visible light in a range for which the mirror of the OLED is transmissive. In a preferred embodiment, any additional PV cell that is included is not sensitive to any of the visible light in a range for which the mirror of the OLED is transmissive.

The fabrication of IR photodetectors was described in previously-referenced U.S. patent application Ser. No. 13/272,995 (filed Oct. 13, 2011), which claims priority to U.S. Provisional Patent Application Ser. No. 61/416,630 (filed Nov. 23, 2010), and/or was described in U.S. Provisional Patent Application Ser. No. 61/416,630 (filed Nov. 23, 2010), and will now be described again in detail.

U.S. patent application Ser. No. 13/272,995 (filed Oct. 13, 2011), which claims priority to U.S. Provisional Patent Application Ser. No. 61/416,630 (filed Nov. 23, 2010), and/or U.S. Provisional Patent Application Ser. No. 61/416,630 (filed Nov. 23, 2010) describe an infrared photodetector with high detectivity for use as a sensor and for use in up-conversion devices. When the dark current is the dominant noise factor, detectivity can be expressed as the following equation (1).

$$D^* = R/(2qJ_d)^{1/2} \quad (1)$$

where R is the responsivity, $J_d$ is the dark current density, and q is the elementary charge ($1.6 \times 10^{-19}$ C). To achieve a photodetector with an optimal detectivity, a very low dark current density is required. The photodetectors according to embodiments of the invention include a hole blocking layer (HBL) with a deep highest occupied molecule orbital (HOMO) and an electron blocking layer (EBL) with a high lowest unoccupied molecule orbital (LUMO) where the EBL is situated on the anode facing surface and the HBL is situated on the cathode facing surface of an IR photosensitive layer. The layers can range from about 20 nm to about 500 nm in thickness, and where the overall spacing between electrodes is less than 5 µm. The IR photodetector according to embodiments of the invention allows high detectivity at applied voltages less than 5V.

The IR photosensitive layer can be an organic or organometallic including material or an inorganic material. The material can absorb through a large portion of the IR extending beyond the near IR (700 to 1400 nm), for example to wavelengths up to 1800 nm, 2000, nm, 2500 nm or greater. Exemplary organic or organometallic including materials include: perylene-3,4,9,10-tetracarboxylic-3,4,9,10-dianhydride (PCTDA), tin (II) phthalocyanine (SnPc), SnPc:$C_{60}$, aluminum phthalocyanine chloride (AlPcCl), AlPcCl:$C_{60}$, titanyl phthalocyanine (TiOPc), and TiOPc:$C_{60}$. Inorganic materials for use as photosensitive layers include: PbSe quantum dots (QDs), PbS QDs, PbSe thin films, PbS thin films, InAs, InGaAs, Si, Ge, and GaAs.

The HBL can be an organic or organometallic including material including, but not limited to: 2,9-Dimethyl-4,7-diphenyl-1,10-phenanthroline (BCP), bis(triphenylsilyl)benzene (UGH2), 4,7-diphenyl-1,10-phenanthroline (BPhen), tris-(8-hydroxy quinoline)aluminum ($Alq_3$), 3,5'-N,N'-dicarbazole-benzene (mCP), $C_{60}$, and tris[3-(3-pyridyl)-mesityl]borane (3TPYMB). Alternatively, the HBL can be an inorganic material including, but not limited to thin films or nanoparticles of ZnO or $TiO_2$.

The EBL can be an organic material, for example, but not limited to poly(9,9-dioctyl-fluorene-co-N-(4-butylphenyl) diphenylamine) (TFB), 1,1-bis[(di-4-tolylamino)phenyl]cyclohexane (TAPC), N,N'-diphenyl-N,N'(2-naphthyl)-(1,1'-phenyl)-4,4'-diamine (NPB), N,N'-diphenyl-N,N'-di(m-tolyl)benzidine (TPD), poly-N,N'-bis-4-butylphenyl-N,N'-bis-phenylbenzidine (poly-TPD), or polystyrene-N,N-diphenyl-N,N-bis(4-n-butylphenyl)-(1,10-biphenyl)-4,4-diamine-perfluorocyclobutane (PS-TPD-PFCB).

Photodetectors were prepared having no blocking layer, poly-TPD as an EBL, ZnO nanoparticles as a HBL, and with poly-TPD and ZnO nanoparticles as an EBL and a HBL, respectively, where the IR photosensitive layer included PbSe nanocrystals. The dark current-voltage (J-V) plots for the photodetectors decreased by more than 3 orders of magnitude for that with an EBL and a HBL from the photodetector that is blocking layer free. The photodetector with both blocking layers shows a detectivity of more than $10^{11}$ Jones over IR and visible wavelengths smaller than 950 nm.

Inorganic nanoparticle photodetectors were also constructed having no blocking layers and with EBL and HBL layers. The photodetector included various HBLs (BCP, C60, or ZnO), EBLs (TFB or poly-TPD), and PbSe quantum dots included the IR photosensitive layer. Although the magnitude of reduction differs, placement of an EBL and a HBL are placed on the PbSe including photodetector results in a significant reduction of the dark current at low applied voltages.

EXAMPLE 1

An OLED for use in an apparatus of the subject invention was fabricated, including: a glass substrate having a thickness of about 1 mm; a dielectric stack mirror directly on the glass substrate; a transparent anode electrode comprising ITO and having a thickness of about 110 nm directly on the dielectric stack mirror; a hole transporting layer comprising NPB and having a thickness of about 70 nm directly on the transparent anode electrode; an organic light-emitting layer comprising Alq3 and having a thickness of about 70 nm directly on the hole transporting layer; and a transparent cathode electrode comprising an Alq3 layer having a thickness of about 50 nm and a Mg:Ag layer having a thickness of about 11 nm directly on the organic light-emitting layer.

Figure 3C:
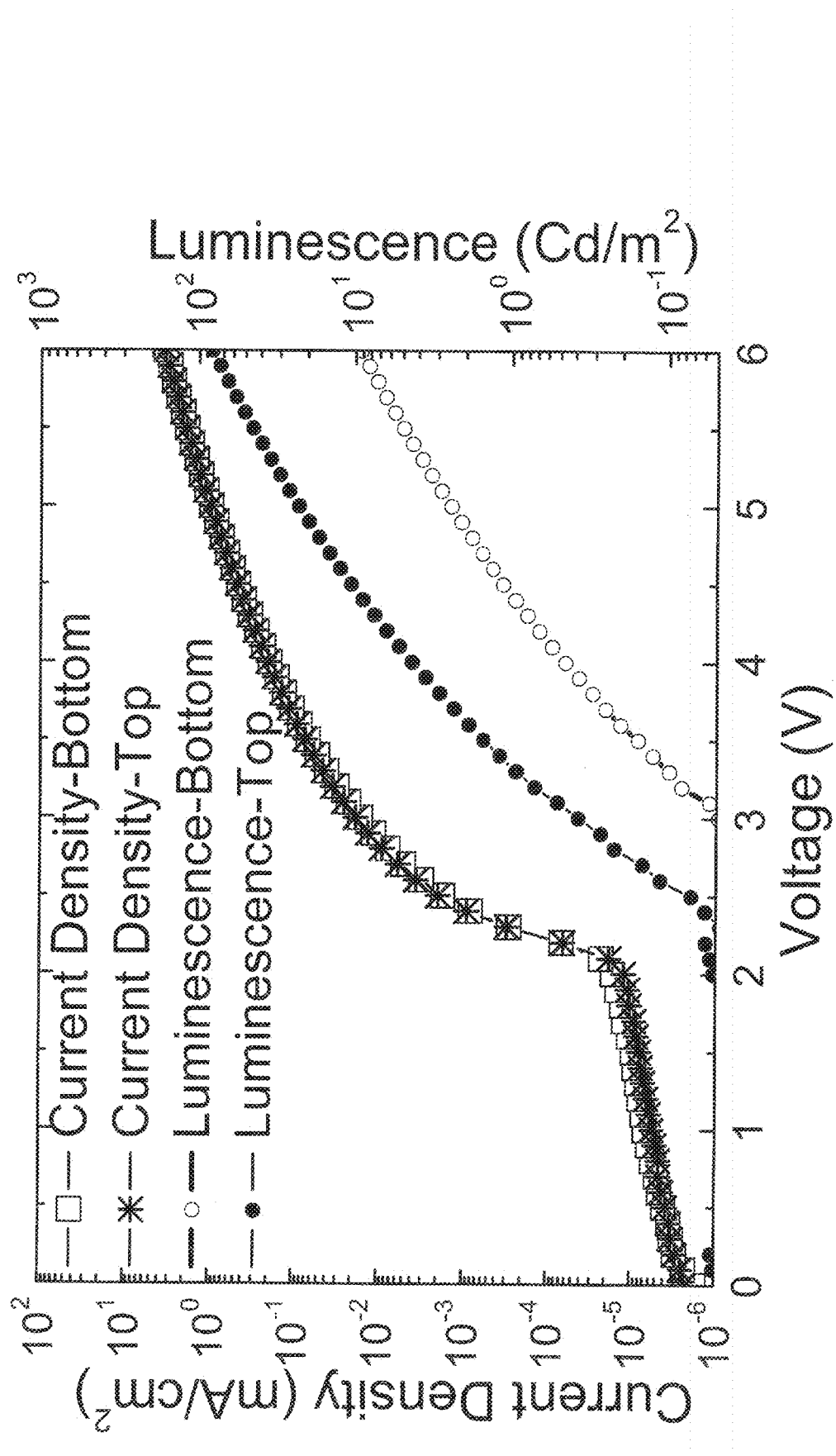
FIG. 3C shows current density and luminescence vs. voltage for an OLED according to an embodiment of the subject invention.
Figure 3D:
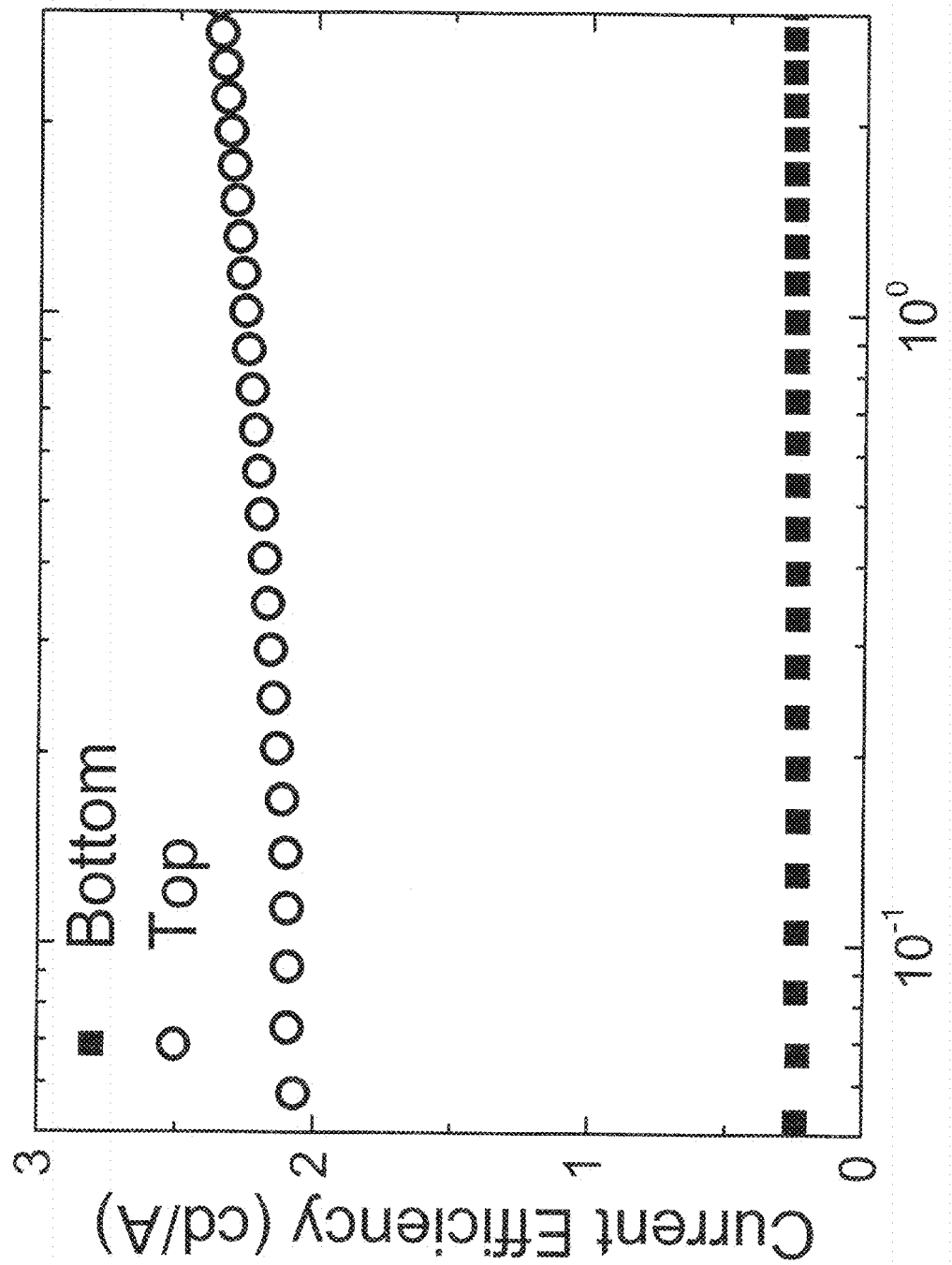
FIG. 3D shows current efficiency vs. current density for an OLED according to an embodiment of the subject invention.

Referring to FIG. 3C, current density (mA/cm$^2$) and luminescence (Cd/m$^2$) are shown as a function of voltage for both the top and bottom emission of this one-sided transparent OLED. The top emitting to bottom emitting ratio for this OLED is about 9:1. Referring to FIG. 3D, current efficiency (cd/A) is shown as a function of current density (mA/cm$^2$) for both the top and bottom emission of this one-sided transparent OLED.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

What is claimed is:

1. An apparatus, comprising:
    an organic light-emitting device (OLED); and
    a photovoltaic (PV) cell, wherein the PV cell is sensitive to photons having one or more wavelengths, wherein the one or more wavelengths are in a PV cell wavelength range, and wherein at least one of the one or more wavelengths is greater than 0.70 μm,
    wherein the OLED comprises:
        an organic light emitting layer;
        a mirror;
        an OLED anode electrode, wherein the OLED anode electrode is transparent to visible light; and
        an OLED cathode electrode, wherein the OLED cathode electrode is transparent to visible light,
        wherein the organic light emitting layer is positioned between the OLED anode electrode and the OLED cathode electrode, and wherein the mirror is positioned such that one of the OLED anode electrode and the OLED cathode electrode is between the mirror and the organic light emitting layer, and
        wherein at least a portion of the mirror is reflective of a first visible light wavelength range, wherein at least a first portion of visible light emitted by the organic light emitting layer has a wavelength within the first visible light wavelength range, and wherein said portion of the mirror is transmissive to a second visible light wavelength range, wherein the organic light emitting layer does not emit light having wavelengths in at least a portion of the second visible light wavelength range.

2. The apparatus according to claim 1, wherein the apparatus is configured such that at least a portion of light incident on an input surface of the PV cell that passes through the PV cell and exits an output surface of the PV cell is incident on an input surface of the OLED and passes through the OLED.

3. The apparatus according to claim 1, wherein the PV cell is directly on the OLED such that the PV cell is in direct contact with the OLED.

4. An apparatus, comprising:
    an organic light-emitting device (OLED); and
    a photovoltaic (PV) cell, wherein the PV cell is sensitive to photons having one or more wavelengths, wherein the one or more wavelengths are in a PV cell wavelength range, and wherein at least one of the one or more wavelengths is greater than 0.70 μm,
    wherein the OLED comprises:
        an organic light emitting layer;
        a mirror;
        an OLED anode electrode, wherein the OLED anode electrode is transparent to visible light;
        an OLED cathode electrode, wherein the OLED cathode electrode is transparent to visible light; and
        at least one optically clear plastic film or at least one glass substrate between the PV cell and the OLED,
        wherein the organic light emitting layer is positioned between the OLED anode electrode and the OLED cathode electrode, and wherein the mirror is positioned such that one of the OLED anode electrode and the OLED cathode electrode is between the mirror and the organic light emitting layer, and
        wherein the mirror is reflective of a first visible light wavelength range, wherein at least a first portion of visible light emitted by the organic light emitting layer has a wavelength within the first visible light wavelength range, wherein the mirror is transmissive to a second visible light wavelength range, and wherein the organic light emitting layer does not emit light having wavelengths in at least a portion of the second visible light wavelength range.

5. The apparatus according to claim 4, wherein the PV cell is integrated onto the at least one optically clear plastic film.

6. The apparatus according to claim 4, wherein the OLED is integrated onto the at least one optically clear plastic film.

7. The apparatus according to claim 4, wherein the PV cell is integrated onto the at least one glass substrate.

8. The apparatus according to claim 4, wherein the OLED is integrated onto the at least one glass substrate.

9. The apparatus according to claim 1, wherein the visible light emitted by the organic light emitting layer has wavelengths within the first visible light wavelength range, wherein the organic light emitting layer does not emit light having wavelengths in the second visible wavelength range.

10. An apparatus, comprising:
    an organic light-emitting device (OLED); and
    a photovoltaic (PV) cell, wherein the PV cell is sensitive to photons having one or more wavelengths, wherein the one or more wavelengths are in a PV cell wavelength range, and wherein at least one of the one or more wavelengths is greater than 0.70 μm,
    wherein the OLED comprises:
        an organic light emitting layer;
        a mirror;
        an OLED anode electrode, wherein the OLED anode electrode is transparent to visible light; and
        an OLED cathode electrode, wherein the OLED cathode electrode is transparent to visible light,
        wherein the organic light emitting layer is positioned between the OLED anode electrode and the OLED cathode electrode, and wherein the mirror is positioned such that one of the OLED anode electrode and the OLED cathode electrode is between the mirror and the organic light emitting layer,
        wherein the mirror is reflective of a first visible light wavelength range, wherein at least a first portion of visible light emitted by the organic light emitting layer has a wavelength within the first visible light wavelength range, wherein the mirror is transmissive to a second visible light wavelength range, and wherein the organic light emitting layer does not emit light having wavelengths in at least a portion of the second visible light wavelength range, and wherein the mirror comprises a dielectric stack mirror.

11. The apparatus according to claim 10, wherein the dielectric stack mirror comprises a $Ta_2O_5$ layer and an $SiO_2$ layer.

12. The apparatus according to claim 11, wherein the dielectric stack mirror comprises alternating layers of $Ta_2O_5$ and $SiO_2$, wherein each $Ta_2O_5$ layer has a thickness of from about 10 nm to about 100 nm, and wherein each $SiO_2$ layer has a thickness of from about 10 nm to about 100 nm.

13. The apparatus according to claim 12, wherein the dielectric stack mirror comprises N layers of $Ta_2O_5$, wherein the number of layers of $SiO_2$, is a range of from N−1 to N+1, and wherein N is in a range of from 1 to 40.

14. The apparatus according to claim 1, wherein the OLED further comprises a hole transporting layer and an electron transporting layer.

15. The apparatus according to claim 1, wherein the organic light-emitting layer comprises Ir(ppy)3, MEH-PPV, Alq3, or Flrpic.

16. The apparatus according to claim 14, wherein the hole transporting layer comprises NPB, TAPC, TFB, or TPD.

17. The apparatus according to claim 14, wherein the electron transporting layer comprises BCP, Bphen, 3TPYMB, or Alq3.

18. The apparatus according to claim 1, wherein the OLED anode electrode comprises at least one material selected from the group consisting of: indium tin oxide (ITO), carbon nanotubes (CNTs), indium zinc oxide (IZO), a silver nanowire, and a magnesium:silver/Alq3 (Mg:Ag/Alq3) stack layer, and wherein the OLED cathode electrode comprises at least one material selected from the group consisting of: ITO, CNTs, IZO, a silver nanowire, and a Mg:Ag/Alq3 stack layer.

19. The apparatus according to claim 18, wherein the OLED cathode electrode comprises a Mg:Ag/Alq3 stack layer, wherein the Mg:Ag layer has a thickness of less than 30 nm, and wherein Mg and Ag are present in a ratio of 10:1 (Mg:Ag), and wherein the Alq3 layer has a thickness of from 0 nm to 200 nm.

20. The apparatus according to claim 1, wherein the OLED anode electrode is positioned between the mirror and the organic light emitting layer.

21. An apparatus, comprising:
an organic light-emitting device (OLED); and
a photovoltaic (PV) cell, wherein the PV cell is sensitive to photons having one or more wavelengths, wherein the one or more wavelengths are in a PV cell wavelength range, and wherein at least one of the one or more wavelengths is greater than 0.70 μm,
wherein the OLED comprises:
an organic light emitting layer;
a mirror;
an OLED anode electrode, wherein the OLED anode electrode is transparent to visible light; and
an OLED cathode electrode, wherein the OLED cathode electrode is transparent to visible light,
wherein the organic light emitting layer is positioned between the OLED anode electrode and the OLED cathode electrode, and wherein the mirror is positioned such that one of the OLED anode electrode and the OLED cathode electrode is between the mirror and the organic light emitting layer, and
wherein the mirror is reflective of a first visible light wavelength range, wherein at least a first portion of visible light emitted by the organic light emitting layer has a wavelength within the first visible light wavelength range, wherein the mirror is transmissive to a second visible light wavelength range, and
wherein the organic light emitting layer does not emit light having wavelengths in at least a portion of the second visible light wavelength range, and
wherein the OLED cathode electrode is positioned between the mirror and the organic light emitting layer.

22. The apparatus according to claim 1, wherein the OLED further comprises:
a glass substrate;
a hole transporting layer on the OLED anode electrode;
wherein the mirror comprises a dielectric stack mirror, wherein the dielectric stack mirror is positioned on the glass substrate, wherein the dielectric stack mirror comprises alternating layers of $Ta_2O_5$ and $SiO_2$;
wherein the OLED anode electrode is positioned on the dielectric stack mirror, wherein the OLED anode electrode comprises ITO;
wherein the organic light-emitting layer is positioned on the hole transporting layer; and
wherein the OLED cathode electrode is positioned on the organic light-emitting layer,
wherein the OLED cathode electrode comprises a Mg:Ag/Alq3 stack layer, wherein the Mg:Ag layer has a thickness of less than 30 nm, and wherein Mg and Ag are present in a ratio of 10:1 (Mg:Ag), and wherein the Alq3 layer has a thickness of from 0 nm to 200 nm.

23. An apparatus, comprising:
an organic light-emitting device (OLED); and
a photovoltaic (PV) cell, wherein the PV cell is sensitive to photons having one or more wavelengths, wherein the one or more wavelengths are in a PV cell wavelength range, and wherein at least one of the one or more wavelengths is greater than 0.70 μm,
wherein the OLED comprises:
an organic light emitting layer;
a mirror;
an OLED anode electrode, wherein the OLED anode electrode is transparent to visible light; and
an OLED cathode electrode, wherein the OLED cathode electrode is transparent to visible light,
wherein the organic light emitting layer is positioned between the OLED anode electrode and the OLED cathode electrode, and wherein the mirror is positioned such that one of the OLED anode electrode and the OLED cathode electrode is between the mirror and the organic light emitting layer, and
wherein the mirror is reflective of a first visible light wavelength range, wherein at least a first portion of visible light emitted by the organic light emitting layer has a wavelength within the first visible light wavelength range, wherein the mirror is transmissive to a second visible light wavelength range, and
wherein the organic light emitting layer does not emit light having wavelengths in at least a portion of the second visible light wavelength range, and
wherein the PV cell comprises an infrared sensitizing material layer comprising quantum dots.

24. The apparatus according to claim 23, wherein the quantum dots are PbS quantum dots or PbSe quantum dots.

25. The apparatus according to claim 1, wherein the PV cell is sensitive to photons having a wavelength of from 700 nm to about 2000 nm.

26. The apparatus according to claim 25, wherein the PV cell is not sensitive to photons having a wavelength of less than 700 nm.

27. The apparatus according to claim 1, wherein the PV cell comprises a PV cell anode electrode and a PV cell cathode electrode.

28. The apparatus according to claim 27, wherein the PV cell anode electrode comprises at least one material selected from the group consisting of indium tin oxide (ITO), carbon nanotubes (CNTs), indium zinc oxide (IZO), a silver nanowire, and a magnesium:silver/Alq3 stack layer, and wherein the PV cell cathode electrode comprises at least one material selected from the group consisting of ITO, CNTs, IZO, a silver nanowire, and a magnesium:silver/Alq3 stack layer.

29. The apparatus according to claim 28, wherein at least one of the PV cell anode electrode or the PV cell cathode electrode comprises a magnesium:silver/Alq3 stack layer, and wherein a magnesium:silver layer of the magnesium:silver/Alq3 stack layer has a thickness of less than 30 nm, and wherein the magnesium:silver layer has a composition ratio of 10:1 (magnesium:silver).

30. The apparatus according to claim 28, wherein at least one of the PV cell anode electrode or the PV cell cathode electrode comprises a magnesium:silver/Alq3 stack layer, and wherein an Alq3 layer of the magnesium:silver/Alq3 stack layer has a thickness of from 0 nm to about 200 nm.

31. The apparatus according to claim 27, wherein the PV cell anode electrode is transparent to at least a portion of visible light and to at least a portion of infrared light, and wherein the PV cell cathode electrode is transparent to at least a portion of visible light and to at least a portion of infrared light.

32. The apparatus according to claim 1, wherein at least one of the one or more wavelengths to which the PV cell is sensitive is greater than 1 µm.

33. The apparatus according to claim 32, wherein at least one of the one or more wavelengths to which the PV cell is sensitive is in a range of from 0.70 µm to 1 µm.

34. The apparatus according to claim 32, wherein the PV cell is not sensitive to photons having a wavelength of less than 0.70 µm.

35. The apparatus according to claim 1, wherein at least one of the one or more wavelengths to which the PV cell is sensitive is greater than 0.85 µm.

36. The apparatus according to claim 35, wherein at least one of the one or more wavelengths to which the PV cell is sensitive is in a range of from 0.70 µm to 0.85 µm.

37. The apparatus according to claim 35, wherein the PV cell is not sensitive to photons having a wavelength of less than 0.85 µm.

38. The apparatus according to claim 4, wherein the mirror comprises a dielectric stack mirror.

39. The apparatus according to claim 4, wherein the OLED cathode electrode is positioned between the mirror and the organic light emitting layer.

40. The apparatus according to claim 4, wherein the OLED anode electrode is positioned between the mirror and the organic light emitting layer.

41. The apparatus according to claim 4, wherein the PV cell comprises an infrared sensitizing material layer comprising quantum dots.

42. The apparatus according to claim 41, wherein the quantum dots are PbS quantum dots or PbSe quantum dots.

43. The apparatus according to claim 4, wherein the apparatus is configured such that at least a portion of light incident on an input surface of the PV cell that passes through the PV cell and exits an output surface of the PV cell is incident on an input surface of the OLED and passes through the OLED.

44. The apparatus according to claim 4, wherein the visible light emitted by the organic light emitting layer has wavelengths within the first visible light wavelength range, wherein the organic light emitting layer does not emit light having wavelengths in the second visible wavelength range.

45. The apparatus according to claim 4, wherein the OLED further comprises a hole transporting layer and an electron transporting layer.

46. The apparatus according to claim 4, wherein the PV cell is sensitive to photons having a wavelength in the range of about 700 nm to about 2000 nm.

47. The apparatus according to claim 46, wherein the PV cell is not sensitive to photons having a wavelength of less than 700 nm.

48. The apparatus according to claim 4, wherein at least one of the one or more wavelengths to which the PV cell is sensitive is greater than 1 µm.

49. The apparatus according to claim 48, wherein at least one of the one or more wavelengths to which the PV cell is sensitive is in a range from 0.70 µm to 1 µm.

50. The apparatus according to claim 48, wherein the PV cell is not sensitive to photons having a wavelength of less than 0.70 µm.

51. The apparatus according to claim 4, wherein at least one of the one or more wavelengths to which the PV cell is sensitive is greater than 0.85 µm.

52. The apparatus according to claim 51, wherein at least one of the one or more wavelengths to which the PV cell is sensitive is in a range from 0.70 µm to 0.85 µm.

53. The apparatus according to claim 51, wherein the PV cell is not sensitive to photons having a wavelength of less than 0.85 µm.

54. The apparatus according to claim 4, wherein the PV cell comprises a PV cell anode electrode and a PV cell cathode electrode.

55. The apparatus according to claim 54, wherein the PV cell anode electrode is transparent to at least a portion of visible light and to at least a portion of infrared light, and wherein the PV cell cathode electrode is transparent to at least a portion of visible light and to at least a portion of infrared light.

56. The apparatus according to claim 10, wherein the OLED cathode electrode is positioned between the mirror and the organic light emitting layer.

57. The apparatus according to claim 10, wherein the OLED anode electrode is positioned between the mirror and the organic light emitting layer.

58. The apparatus according to claim 10, wherein the PV cell comprises an infrared sensitizing material layer comprising quantum dots.

59. The apparatus according to claim 58, wherein the quantum dots are PbS quantum dots or PbSe quantum dots.

60. The apparatus according to claim 10, wherein the apparatus is configured such that at least a portion of light incident on an input surface of the PV cell that passes through the PV cell and exits an output surface of the PV cell is incident on an input surface of the OLED and passes through the OLED.

61. The apparatus according to claim 10, wherein the PV cell is directly on the OLED such that the PV cell is in direct contact with the OLED.

62. The apparatus according to claim 10, wherein the visible light emitted by the organic light emitting layer has wavelengths within the first visible light wavelength range, wherein the organic light emitting layer does not emit light having wavelengths in the second visible wavelength range.

63. The apparatus according to claim 10, wherein the OLED further comprises a hole transporting layer and an electron transporting layer.

64. The apparatus according to claim 10, wherein the PV cell is sensitive to photons having a wavelength in the range of about 700 nm to about 2000 nm.

65. The apparatus according to claim 64, wherein the PV cell is not sensitive to photons having a wavelength of less than 700 nm.

66. The apparatus according to claim 10, wherein at least one of the one or more wavelengths to which the PV cell is sensitive is greater than 1 μm.

67. The apparatus according to claim 66, wherein at least one of the one or more wavelengths to which the PV cell is sensitive is in a range from 0.70 μm to 1 μm.

68. The apparatus according to claim 66, wherein the PV cell is not sensitive to photons having a wavelength of less than 0.70 μm.

69. The apparatus according to claim 10, wherein at least one of the one or more wavelengths to which the PV cell is sensitive is greater than 0.85 μm.

70. The apparatus according to claim 69, wherein at least one of the one or more wavelengths to which the PV cell is sensitive is in a range from 0.70 μm to 0.85 μm.

71. The apparatus according to claim 69, wherein the PV cell is not sensitive to photons having a wavelength of less than 0.85 μm.

72. The apparatus according to claim 10, wherein the PV cell comprises a PV cell anode electrode and a PV cell cathode electrode.

73. The apparatus according to claim 72, wherein the PV cell anode electrode is transparent to at least a portion of visible light and to at least a portion of infrared light, and wherein the PV cell cathode electrode is transparent to at least a portion of visible light and to at least a portion of infrared light.

74. The apparatus according to claim 21, wherein the PV cell comprises an infrared sensitizing material layer comprising quantum dots.

75. The apparatus according to claim 74, wherein the quantum dots are PbS quantum dots or PbSe quantum dots.

76. The apparatus according to claim 21, wherein the apparatus is configured such that at least a portion of light incident on an input surface of the PV cell that passes through the PV cell and exits an output surface of the PV cell is incident on an input surface of the OLED and passes through the OLED.

77. The apparatus according to claim 21, wherein the PV cell is directly on the OLED such that the PV cell is in direct contact with the OLED.

78. The apparatus according to claim 21, wherein the visible light emitted by the organic light emitting layer has wavelengths within the first visible light wavelength range, wherein the organic light emitting layer does not emit light having wavelengths in the second visible wavelength range.

79. The apparatus according to claim 21, wherein the OLED further comprises a hole transporting layer and an electron transporting layer.

80. The apparatus according to claim 21, wherein the PV cell is sensitive to photons having a wavelength in the range of about 700 nm to about 2000 nm.

81. The apparatus according to claim 80, wherein the PV cell is not sensitive to photons having a wavelength of less than 700 nm.

82. The apparatus according to claim 21, wherein at least one of the one or more wavelengths to which the PV cell is sensitive is greater than 1 μm.

83. The apparatus according to claim 82, wherein at least one of the one or more wavelengths to which the PV cell is sensitive is in a range from 0.70 μm to 1 μm.

84. The apparatus according to claim 82, wherein the PV cell is not sensitive to photons having a wavelength of less than 0.70 μm.

85. The apparatus according to claim 21, wherein at least one of the one or more wavelengths to which the PV cell is sensitive is greater than 0.85 μm.

86. The apparatus according to claim 85, wherein at least one of the one or more wavelengths to which the PV cell is sensitive is in a range from 0.70 μm to 0.85 μm.

87. The apparatus according to claim 85, wherein the PV cell is not sensitive to photons having a wavelength of less than 0.85 μm.

88. The apparatus according to claim 21, wherein the PV cell comprises a PV cell anode electrode and a PV cell cathode electrode.

89. The apparatus according to claim 88, wherein the PV cell anode electrode is transparent to at least a portion of visible light and to at least a portion of infrared light, and wherein the PV cell cathode electrode is transparent to at least a portion of visible light and to at least a portion of infrared light.

90. The apparatus according to claim 23, wherein the apparatus is configured such that at least a portion of light incident on an input surface of the PV cell that passes through the PV cell and exits an output surface of the PV cell is incident on an input surface of the OLED and passes through the OLED.

91. The apparatus according to claim 23, wherein the PV cell is directly on the OLED such that the PV cell is in direct contact with the OLED.

92. The apparatus according to claim 23, wherein the visible light emitted by the organic light emitting layer has wavelengths within the first visible light wavelength range, wherein the organic light emitting layer does not emit light having wavelengths in the second visible wavelength range.

93. The apparatus according to claim 23, wherein the OLED further comprises a hole transporting layer and an electron transporting layer.

94. The apparatus according to claim 23, wherein the PV cell is sensitive to photons having a wavelength in the range of about 700 nm to about 2000 nm.

95. The apparatus according to claim 94, wherein the PV cell is not sensitive to photons having a wavelength of less than 700 nm.

96. The apparatus according to claim 23, wherein at least one of the one or more wavelengths to which the PV cell is sensitive is greater than 1 μm.

97. The apparatus according to claim 96, wherein at least one of the one or more wavelengths to which the PV cell is sensitive is in a range from 0.70 μm to 1 μm.

98. The apparatus according to claim 96, wherein the PV cell is not sensitive to photons having a wavelength of less than 0.70 μm.

99. The apparatus according to claim 23, wherein at least one of the one or more wavelengths to which the PV cell is sensitive is greater than 0.85 μm.

100. The apparatus according to claim 99, wherein at least one of the one or more wavelengths to which the PV cell is sensitive is in a range from 0.70 μm to 0.85 μm.

101. The apparatus according to claim 99, wherein the PV cell is not sensitive to photons having a wavelength of less than 0.85 μm.

102. The apparatus according to claim 23, wherein the PV cell comprises a PV cell anode electrode and a PV cell cathode electrode.

103. The apparatus according to claim 102, wherein the PV cell anode electrode is transparent to at least a portion of visible light and to at least a portion of infrared light, and wherein the PV cell cathode electrode is transparent to at least a portion of visible light and to at least a portion of infrared light.

* * * * *